(12) United States Patent
Smeeton et al.

(10) Patent No.: US 9,158,178 B2
(45) Date of Patent: Oct. 13, 2015

(54) ULTRAVIOLET LASER

(71) Applicant: SHARP KABUSHIKI KAISHA, Osaka (JP)

(72) Inventors: Tim Smeeton, Oxford (GB); Stewart Hooper, Oxford (GB); Edward Boardman, Abingdon (GB); Robin Mark Cole, London (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/260,693

(22) Filed: Apr. 24, 2014

(65) Prior Publication Data

US 2014/0251949 A1     Sep. 11, 2014

Related U.S. Application Data

(62) Division of application No. 13/278,847, filed on Oct. 21, 2011, now Pat. No. 8,743,922.

(51) Int. Cl.
| | |
|---|---|
| *G02F 1/37* | (2006.01) |
| *G02F 1/35* | (2006.01) |
| *H01S 5/026* | (2006.01) |

(Continued)

(52) U.S. Cl.
CPC .............. *G02F 1/377* (2013.01); *G02F 1/353* (2013.01); *H01S 5/026* (2013.01); *H01S 5/0605* (2013.01); *C02F 1/325* (2013.01); *C02F 2201/3222* (2013.01); *C02F 2201/3226* (2013.01); *C02F 2303/04* (2013.01); *G02B 2006/12097* (2013.01); *G02F 1/3551* (2013.01)

(58) Field of Classification Search
None
See application file for complete search history.

(56) References Cited

U.S. PATENT DOCUMENTS

| | | |
|---|---|---|
| 3,584,230 A | 6/1971 | Tien |
| 4,427,260 A | 1/1984 | Puech et al. |

(Continued)

FOREIGN PATENT DOCUMENTS

| | | |
|---|---|---|
| CN | 1461956 A | 12/2003 |
| JP | 2003-270467 | 9/2003 |

(Continued)

OTHER PUBLICATIONS

European Search Report for corresponding European patent appln. No. 12189250.9 dated Apr. 8, 2013.

(Continued)

*Primary Examiner* — Jerry Rahll
(74) *Attorney, Agent, or Firm* — Renner, Otto, Boisselle & Sklar, LLP

(57) ABSTRACT

A laser device is disclosed that provides at least an ultraviolet laser beam and preferably both an ultraviolet laser beam and a visible laser beam. The laser device includes a semiconductor laser device (e.g. a laser diode) to generate visible laser light which is coupled into a frequency doubling crystal taking the form of a single crystal thin film frequency-doubling waveguide structure. The single crystal thin film frequency-doubling waveguide converts a portion of the visible light emitted by the laser diode into ultraviolet light. Both visible and ultraviolet laser light is emitted from the waveguide. As an example, the single crystal thin film frequency-doubling frequency doubling waveguide includes a frequency doubling crystal region composed of β-BaB$_2$O$_4$ (β-BBO), a cladding region composed of materials that are transparent or nearly transparent at the wavelength of the ultraviolet laser light beam and a supporting substrate composed of any material.

20 Claims, 8 Drawing Sheets

(51) Int. Cl.
*H01S 5/06* (2006.01)
*G02B 6/12* (2006.01)
*G02F 1/377* (2006.01)
*G02F 1/355* (2006.01)
*C02F 1/32* (2006.01)

(56) References Cited

U.S. PATENT DOCUMENTS

| | | | |
|---|---|---|---|
| 4,865,406 | A | 9/1989 | Khanarian et al. |
| 4,951,293 | A | 8/1990 | Yamamoto et al. |
| 5,123,731 | A | 6/1992 | Yoshinaga et al. |
| 5,157,674 | A | 10/1992 | Lawandy |
| 5,175,784 | A | 12/1992 | Enomoto et al. |
| 5,177,752 | A | 1/1993 | Ohya et al. |
| 5,359,617 | A | 10/1994 | Kano et al. |
| 5,751,751 | A | 5/1998 | Hargis et al. |
| 6,631,231 | B2 | 10/2003 | Mizuuchi et al. |
| 7,433,374 | B2 | 10/2008 | Govorkov et al. |
| 2003/0031411 | A1 | 2/2003 | Arbore et al. |
| 2003/0133680 | A1 | 7/2003 | Yokoyama et al. |
| 2003/0223722 | A1 | 12/2003 | Sugita et al. |
| 2007/0269178 | A1 | 11/2007 | Sarukura et al. |
| 2008/0085089 | A1 | 4/2008 | Catching et al. |
| 2008/0151948 | A1 | 6/2008 | Govorkov et al. |
| 2010/0189155 | A1 | 7/2010 | Tanaka et al. |
| 2010/0226001 | A1 | 9/2010 | Yoshino |
| 2011/0013657 | A1 | 1/2011 | Sumitomo et al. |
| 2012/0134012 | A1 | 5/2012 | Guerin et al. |

FOREIGN PATENT DOCUMENTS

| | | |
|---|---|---|
| JP | 2004-287215 | 10/2004 |
| JP | 2005-300672 | 10/2005 |
| JP | 2007-183316 | 7/2007 |
| JP | 2007-334306 | 12/2007 |
| JP | 2009-198651 | 9/2009 |
| JP | 2009-271435 | 11/2009 |
| JP | 2010-204505 | 9/2010 |
| JP | 2011-023535 | 2/2011 |
| WO | 2006-103938 | 10/2006 |
| WO | 2008/143276 | 11/2008 |

OTHER PUBLICATIONS

P. Vesarach et al. "Tunable UV Generation from Extended Cavity DVD Laser Diode and Nonlinear Optical Crystal", Laser and Electro-Optics, 2005. Cleo/Pacific Rim 2005. Pacific Rim Conference on Tokyo, Japan 30-02 Aug. 2005, Piscataway, NJ, USA, IEEE, Aug. 30, 2005, pp. 877-878, XP010872736.

R. Degl'Innocenti et al. "Second harmonic generation of continuous wave ultraviolet light and production of β-BaB2O4 optical waveguides", Applied Physics Letters, AIP, American Institute of Physics, Melville, NY, US, vol. 89, No. 4, Jul. 24, 2006, pp. 41103-41103, XP012088068.

K Ohara et al. "210 nm ultraviolet generation using blue-violet laser diode and BBO SHG crystal", Cleo/Pacific Rim 2003—The 5th Pacific Rim Conference on Laser and Electro-Optics, Dec. 15-19, 2003, Piscataway, NJ, USA, IEEE, vol. 1, Dec. 15, 2003, pp. 355-355, XP010689339.

D. N. Nikogosyan et al. "New formulas for the calculation of phase-matching angles", Soviet Journal of Quantum Electronics USA, vol. 16, No. 12, Dec. 1986, pp. 1663-1664, XP002694359.

A. Boudrioua et al. "Helium ion-implanted planer waveguide in Y-cut and Z-cut β-BBO (BaB2O4)", Optical Materials, Elsevier Science Publishers B.V. Amsterdam, NL, vol. 14, No. 1, Mar. 1, 2000, p. 31-39, XP004190761.

K Mizuuchi et al. "Efficient 340-nm light generation by a ridge-type waveguide in a first-order periodically poled MgO:LiNbO3", Optics Letters, OSA, Optical Society of America, Washington, DC, US, vol. 28, No. 15, Aug. 1, 2003, pp. 1344-1346, XP002996763.

Tsuguo Fukuda, "Recent progress on crystals for optoelectronic applications", Ouyou Butsuri, Applied Physics, vol. 63, No. 3, 1994, pp. 248-254.

Takatomo Sasaki, "Recent trends in advanced solid-state laser materials and optical nonlinear materials", Ouyou Butsuri, Applied Physics, vol. 64, No. 9, 1994, pp. 878-887.

Japanese Office Action (and English translation) for Japanese Application No. 2012-231165 dated Sep. 24, 2013.

J. Hastie et. al., "High power ultraviolet VECSEL through intracavity frequency-doubling in BBO", IEEE, 2006, pp. 109-110.

K. Ohara et al. "0.2 m Deep UV Generation using 0.4 m Blue Laser Diode with Wavelength Tunable Cavity" Date of conference Feb. 8, 2005, pp. 1 -2.

S Y Zhai et. al. "A compact efficient deep ultraviolet laser at 266 nm" Laeser Phys. Lett. 10 (2013) pp. 1-5.

Kenji Ohara et. al. "210 nm Ultraviolet Generation Using Blue-Violet Laser Diode and BBO SHG Crystal" IEEE, 2003 p. 355.

Fengjiang Zhuang et. al. "Multi-reflected enhancement of fourth harmonic DUV laser generation at 266 nm" 2010 Optical Society of America, Nov. 22, 2010/ vol. 18, No. 24/ Optics Express pp. 25339-25345.

T. Taniuchi et al. "Blue and Ultraviolet emission form frequency doubled diode lasers" pp. 388-391.

E. A. Boardman et al. "Deep ultraviolet (UVC) laser for sterilization and fluorescence applications", 2012, pp. 31-35.

W.J. Kozlovsky et al, "Generation of 41 nm of blue radiation by frequency doubling of a GaAlAs diode laser" Appl. Phys. Lett. 56, 2291 (1990) pp. 2291-2292.

R. Degl'Innocenti et al. "Second harmonic generation of continuous wave ultraviolet light and production of β-BaB2O4 optical waveguides" Appl. Phys. Lett. 89, 041103 (2006), pp. 041103-1 through 041103-3.

FIG. 19

| λ₁ / nm | θ /° |
|---|---|
| 410 | 87.0 |
| 415 | 79.7 |
| 420 | 75.9 |
| 425 | 73.0 |
| 430 | 70.5 |
| 435 | 68.4 |
| 440 | 66.5 |
| 445 | 64.9 |
| 450 | 63.3 |
| 455 | 61.9 |
| 460 | 60.6 |
| 465 | 59.3 |
| 470 | 58.1 |
| 475 | 57.1 |
| 480 | 56.0 |
| 485 | 55.0 |
| 490 | 54.1 |
| 495 | 53.2 |
| 500 | 52.3 |
| 505 | 51.5 |
| 510 | 50.7 |
| 515 | 50.0 |
| 520 | 49.3 |
| 525 | 48.6 |
| 530 | 47.9 |
| 535 | 47.2 |
| 540 | 46.6 |
| 545 | 46.0 |
| 550 | 45.4 |
| 555 | 44.9 |
| 560 | 44.3 |

ULTRAVIOLET LASER

RELATED APPLICATION DATA

This application is a divisional of U.S. application Ser. No. 13/278,847 filed on Oct. 21, 2011, which is incorporated by reference in its entirety.

TECHNICAL FIELD

The present invention relates to a device for the emission of ultraviolet laser light and more particularly to a device with a frequency doubling waveguide type optical component for converting visible laser light into ultraviolet laser light and a process for manufacturing the frequency doubling waveguide. The device may be used as the light source in products designed for the germicidal treatment of water.

BACKGROUND ART

There is an ever increasing need for clean and safe air to breathe and water to drink, particularly in heavily populated countries or regions throughout the world. A major, high-volume, application for compact solid-state deep UV light sources is for chemical-free sterilisation of air or water. Deep UV light—that is light in the UVC range which has wavelength shorter than 280 nm—efficiently causes permanent physical damage to DNA which prevents bacteria, viruses and fungi from replicating. This means that deep UV treatment can be used to disinfect air or water at point-of-use for safe breathing or drinking. Deep UV light is particularly effective at destroying e-coli bacteria. Deep UV light can also be used to disinfect surfaces.

Deep UV light can also be used to reduce the toxicity of chemical pollutants such as dissolved organic chemicals which are present in water and thereby make the water safe to drink. In this case the deep UV light initiates photocatalytic oxidation reactions which break down the dissolved organic chemicals into less-hazardous or non-hazardous byproducts. The initiation of photocatalytic oxidation reactions is most efficient for deep UV light with wavelengths shorter than 230 nm.

Compact solid-state deep UV light sources also have application in bio- and chemical-sensing because biological and chemical compounds strongly absorb deep UV light. Proteins and other organic chemicals can be identified from their fluorescence spectra. A fluorescence measurement requires illumination with light at a short wavelength at which the compounds are strongly absorbing and detection of the resulting fluorescence at longer wavelengths. Wavelengths near 280 nm are suitable but shorter 220 nm wavelengths are much preferred owing to the stronger absorbance at this wavelength.

Point-of-use products for the UV treatment of air and water are already available and these products use mercury lamps as the UV light source. However, mercury lamps contain toxic material, tend to have short operating lifetimes and long warm-up times and require high driving voltages. Furthermore, the UV light emitted from mercury lamps is emitted in a broad range of directions and from a relatively large area which means it cannot be efficiently focused into a small area or a collimated beam.

An alternative UV light source currently under development is the UV LED. The current draw-backs to using UV LEDs include that they have short operating lifetimes and that they cannot be efficiently focused to provide a collimated beam or tightly focused light spot. In addition, the performance of UV LEDs with emission wavelengths shorter than 260 nm is very poor. Therefore, these devices are poorly suited for the applications described above which benefit from a light source with wavelength shorter than 260 nm.

Deep UV lasers potentially provide a monochromatic, coherent beam which can be efficiently collected into a collimated beam or focused into a small area and can be modulated rapidly (as required for fluorescence measurements, for example). However, existing lasers with emission wavelengths shorter than 280 nm are very expensive components such as gas lasers designed for industrial use. No laser diodes have been made with emission wavelength shorter than 280 nm.

A deep UV laser can be realised by frequency doubling a visible laser beam inside a suitable non-linear optical material. (e.g. Beta-Barium Borate which is commonly known as BBO), as first reported in *IEEE Journal of Quantum Electronics* QE-22, No 7 (1986). The visible light is focused into the non-linear optical material and the light is frequency-doubled (FD) by the process of second harmonic generation (SHG). The SHG process converts the visible input light into light with wavelength half the wavelength of the input light. The frequency-doubled light has properties similar to the properties of light emitted by a laser and it is common in the prior art for the light to be described as "laser light". It is also common in the prior art for a device which emits frequency-doubled light to be described as "laser". As used herein, the term "laser light" includes light emitted by a laser device as well as frequency-doubled light derived from light emitted by a laser device. Further, as used herein a "laser light source" includes a light source that exhibits light amplification by stimulated emission of radiation, as well as a device that that implements frequency doubling of light emitted by a light source that exhibits light amplification by stimulated emission of radiation. Frequency-doubled UV lasers made in this way using BBO can be made to emit wavelengths as short as 205 nm.

Nishimura et al in *JJAP* 42, 5079 (2003) were the first to report on making a UV laser using BBO and using a blue-violet semiconductor laser diode to generate the "pump" visible laser beam. A potential advantage of this approach is that blue-violet semiconductor laser diodes are compact and low-cost components. However, the SHG process in BBO occurs with low efficiency for the relatively low powers of light emitted from blue-violet semiconductor laser diodes. Consequently, although a complex optical system was used to recirculate the blue light through the BBO component to improve efficiency, the UV output power achieved in this prior art was still low. Therefore, this method is not suitable to fabricate a low-cost high-power UV light source for the applications described above. Neither of the two most recently mentioned pieces of prior art discuss the use of a frequency doubling waveguide.

One method which has been used to increase frequency-doubling efficiency has been to use a frequency-doubling waveguide. A frequency-doubling waveguide is designed to confine the pump light and frequency-doubled light to a small cross-sectional area as they pass through the non-linear optical material. The light is confined and guided along the non-linear optical material by internal reflection at the interfaces between the non-linear optical material and the surrounding material (or gas), which have a different refractive index. The light may be confined in one dimension which is perpendicular to the propagation direction of the light—this is commonly referred to as a "planar" waveguide. Alternatively the light may be confined in the two dimensions which are perpendicular to the propagation direction of the light in either "channel" or "ridge" waveguides. By confining the light to a small area the efficiency of the SHG process can be significantly increased. The earliest report of using a frequency doubling waveguide is disclosed in U.S. Pat. No. 3,584,230 (Tien, Jun. 8, 1971) in the form of a thin non-linear optical film deposited on a substrate. This prior art does not use a visible laser diode nor BBO as the FD waveguide material so does not provide a method to make a UV laser. In particular, there is no method known in the prior art to deposit high-quality single crystal BBO thin films onto substrates, other than homoepitaxial deposition onto BBO substrates which provide no refractive index contrast with the deposited BBO layer as required for a waveguide. Therefore, this method is not suitable to fabricate a high-quality waveguide for a deep UV laser.

A waveguide can be formed inside a bulk non-linear optical crystal by generating a refractive index contrast within the crystal using conventional methods of diffusion, proton exchange or implantation. U.S. Pat. No. 4,427,260 (Puech et al., Jan. 24, 1984) describes an invention of a non-linear optical device where a laser diode pumps a FD waveguide formed using Ni diffusion. This prior art does not discuss the use of BBO, nor any other nonlinear material suitable for frequency-doubling to deep UV wavelengths, and it is not clear that diffusion can be used to form high-quality waveguides suitable for use in a deep UV laser. Furthermore, this prior art does not provide cladding layers with composition significantly different from that of the non-linear crystal, as is required to make a waveguide where the light is strongly confined. *APL* 41, 7, p 607 (1982), U.S. Pat. No. 4,951,293 (Yamamoto et al., Aug. 21, 1990), and *APL* 85, 9 1457 (2004) report the formation of FD waveguides using Ti diffusion, proton exchange or implantation. The latter reports on using BBO but none of them provide cladding layers with composition significantly different from that of the non-linear crystal. Furthermore, these methods for fabrication a waveguides tend to result in high absorption losses for ultraviolet light with very short wavelength (e.g. wavelength less than 280 nm).

U.S. Pat. No. 5,175,784 (Enomoto et al., Dec. 29, 1992) describes a FD waveguide structure made by depositing a non-linear optical thin film onto a substrate and then etching into a ridge structure. BBO is given as several examples. However, there is no method known in the prior art to deposit high-quality single crystal BBO thin films onto substrates, other than homoepitaxial deposition onto BBO substrates which provide no refractive index contrast with the deposited BBO layer as required for a waveguide. Therefore, this method is not suitable to fabricate a high-quality waveguide for a deep UV laser.

*APL* 89 041103 (2006) reports on the formation of a frequency doubling ridge waveguide in a BBO crystal using implantation of helium ions and dry etching. The generation of a UV laser by FD a visible laser beam using the waveguide is also reported. The implanted helium ions form a thin layer a few micrometers below the top surface of the crystal which has a slightly lower refractive index than that of the crystal between the layer and the surface. The light is confined in the crystal between the top surface and the implanted layer. There are significant disadvantages to using implantation to form the waveguide. In particular, the refractive index contrast between the implanted layer and the BBO crystal is relatively weak, which means light can "leak" out of the waveguide, the BBO crystal between the implanted layer and the surface is damaged during the implantation process and this reduces the UV output power, and absorption losses for ultraviolet light with very short wavelength (e.g. wavelength less than 280 nm) tend to be high. The visible laser used with the waveguide in this prior art was a bulky and expensive industrial laser which is a further disadvantage of this method.

The use of a lapping and polishing process to fabricate a thin film FD waveguide from a bulk crystal of non-linear optical material is described in two pieces of prior art. Deglinnocenti in *PhD dissertation* ETH No 17145 (2007) mentions that a thin film waveguide can be made by polishing down BBO crystals glued or optically mounted on fused silica substrate. This proposal neglects an important consideration in waveguide design—that of minimising optical absorption losses of the frequency-doubled light. An efficient waveguide requires that the materials surrounding the non-linear optical material core of the waveguide have low absorption of the light in the waveguide. Most materials are strongly absorbing of deep UV light (i.e. wavelengths shorter than 280 nm). In particular this is the case of the vast majority of glues and mounting materials which would be used to attach the BBO crystal to the fused silica substrate. Consequently, a BBO thin film fabricated according to the proposal in this prior art will have high absorption losses of the UV laser wavelength and therefore provide low efficiency. Furthermore, the absorption of the deep UV light will likely contribute to degradation of the material and result in a short lifetime of the waveguide component. U.S. Pat. No. 6,631,231 (Mizuuchi et al., Oct. 7, 2003) discloses an optical waveguide element made by gluing an FD crystal to a substrate and where the glue acts as a cladding region. No mention of BBO is made in this prior art nor is the generation of deep UV laser light.

U.S. Pat. No. 5,123,731 (Yoshinaga et al., Jun. 23, 1992) discloses a laser source that emits both a frequency doubled UV laser beam and another laser beam generated by a laser diode. The use of a frequency doubling waveguide is also disclosed. This prior art does not mention using a visible laser diode nor does it give any details on the construction method of the waveguide.

SUMMARY OF INVENTION

There are no examples in the prior art of using laser diodes with wavelengths in the range 400 nm to 560 nm, as required to generate deep UV light by frequency-doubling, in conjunction with a frequency-doubling waveguide.

An advantage of using a UV laser made by frequency doubling is that the device can emit both the UV laser light and a portion of the visible laser light. The visible laser light beam is particularly useful from a safety point of view, since (unlike deep UV light) it is visible to the naked eye.

A device and method in accordance with the present invention enable a laser light source to simultaneously provide both visible and ultraviolet light.

The concept in accordance with the invention is illustrated in FIG. 1 and includes a semiconductor laser diode 14 to generate visible laser light with wavelength ($\lambda_1$) in the range 400 nm-560 nm which is coupled into a single crystal thin film frequency-doubling waveguide 15. The single crystal thin film frequency-doubling waveguide preferably provides phasematched frequency doubling of the light emitted by the laser diode. In one example the single crystal thin film is $\beta$-BaB$_2$O$_4$. The frequency-doubling waveguide converts a portion of the visible laser beam into ultraviolet light with wavelength ($\lambda_2$) in the range 200 nm-280 nm. Both the visible and ultraviolet light are simultaneously emitted from the frequency-doubling waveguide.

The single crystal thin film frequency-doubling waveguide structure is manufactured using steps including:
  i) applying a cladding layer 3 to one surface of a frequency-doubling single-crystal wafer. The cladding layer material is transparent or nearly transparent to the light emitted by the semiconductor laser diode and to the frequency-doubled ultraviolet light.
  ii) attaching the surface with the cladding layer to a supporting substrate 4
  iii) lapping and polishing the opposite face of the frequency-doubling single crystal to form a thin film (thickness less than 40 μm)
  iv) optionally patterning and etching the polished surface of the frequency-doubling single crystal thin film so as to form a ridge-type waveguide structure
  v) polishing facets so that the light from the semiconductor laser diode can be coupled into the waveguide and the light from the semiconductor laser diode and the frequency-doubled ultraviolet light can be coupled out from the waveguide.

Advantages of the device and method in accordance with the invention include:
a) The conversion efficiency from visible light to deep ultraviolet light is greatly enhanced by confining the visible light and UV light from the laser diode along a single crystal thin film frequency doubling waveguide. The waveguide offers high efficiency owing to it being a high-quality single crystal with small size in at least one dimension perpendicular to the direction of beam propagation and having low absorption losses to both the visible and UV light.
b) The waveguide manufacturing process is simplified and replaces the need to use complicated ion implantation or other expensive techniques. The manufacturing process is also scalable in size to larger waveguide sizes.
c) The laser system has lower cost and size than existing deep UV lasers.
d) Both the visible and UV laser beams are provided by the same light source, therefore, device size and power consumption is low.
e) The visible laser light beam is particularly useful from a safety point of view, since (unlike deep UV light) it is visible to the naked eye.
f) The high efficacy of the deep UV laser wavelength for rapidly destroying bacteria, strongly exciting bacteria fluorescence and being strongly absorbed in contaminated air or water.
g) The use of highly collimated and tightly focused laser beams for fast and effective treatment and achieving high sensing signals from airborne or waterborne micro-organisms.

According to one aspect of the invention, a laser light source for providing ultraviolet light, comprises: a semiconductor laser device configured to emit visible light; and a frequency doubling waveguide including a single crystal thin-film, the waveguide optically coupled to the semiconductor laser device to receive the visible light emitted therefrom, the frequency doubling waveguide configured to convert at least a portion of the received light into ultraviolet light, wherein the waveguide comprises: a frequency doubling region including a single crystal non-linear optical material; a first cladding region comprising material substantially transparent to light having wavelengths of visible and ultraviolet laser light beams; and a supporting substrate; wherein the first cladding region is disposed between the supporting substrate and the frequency doubling region.

According to one aspect of the invention, the semiconductor laser device is configured to emit visible light having a wavelength between 400 nm and 560 nm, and the converted ultraviolet light having a wavelength between 200 nm and 280 nm.

According to one aspect of the invention, the single crystal non-linear optical material has a thickness less than 40 μm, and the first cladding layer has a thickness of more than 100 nm.

According to one aspect of the invention, the single crystal non-linear optical material comprises BBO, and a direction along which the single-crystal non-linear optical material has a thickness less than 40 μm lies less than 5° away from a <2-1-10> BBO crystal direction.

According to one aspect of the invention, the single crystal thin film comprises at least one polished surface forming a principal surface of the single crystal thin film, and the BBO crystal direction is non-parallel to a plane of the at least one polished surface.

According to one aspect of the invention, the single crystal non-linear material comprises BBO, and a direction perpendicular to a plane of a first polished surface of the BBO wafer is within 3° of an angle α=(90−θ)° from the [0001] direction of the BBO crystal, wherein θ>35°.

According to one aspect of the invention, the single crystal non-linear material comprises BBO, and a direction perpendicular to a plane of a first polished surface of the BBO wafer is within 3° of an angle α=(90−θ)° from the [0001] direction of the BBO crystal, wherein θ, measured in degrees, is defined according to the wavelength of the semiconductor laser source, $\lambda_1$, measured in nm, by:

$$\theta = a_5\lambda_1^5 + a_4\lambda_1^4 + a_3\lambda_1^3 + a_2\lambda_1^2 + a_1\lambda_1 + a_0$$

wherein when 410 nm≤$\lambda_1$<411 nm, $a_5$=0; $a_4$=0.188102808664553, $a_3$=−309.194840804581, $a_2$=190590.522011723, $a_1$=−52214207.6963821, $a_0$=5364240308.25265, and when 411 nm≤$\lambda_1$≤440 nm, $a_5$=−0.000001760705106, $a_4$=0.00377476277753, $a_3$=−3.23698468941742, $a_2$=1387.88016707932, $a_1$=−297527.230809678, $a_0$=25512902.6041867, and when 440 nm<$\lambda_1$≤560 nm, $a_5$=−0.000000000333886, $a_4$=0.000000873625719, $a_3$=−0.0009163315 28884, $a_2$=0.482130839856291, $a_1$=−127.52288219078, $a_0$=13654.8448727922.

According to one aspect of the invention, the single crystal nonlinear optical material comprises at least one of Beta-Barium Borate (BBO), potassium fluoroboratoberyllate, lithium tetraborate, lithium rubidium tetraborate or magnesium barium fluoride.

According to one aspect of the invention, the single crystal non-linear optical material is a quasi-phasematched frequency doubling material.

According to one aspect of the invention, the waveguide is configured to provide frequency-doubling with a coherence length between 1 mm and 20 mm.

According to one aspect of the invention, the waveguide is configured to provide a coherence length for frequency doubling that is larger than a length of the waveguide.

According to one aspect of the invention, a dominant polarization of light entering the waveguide has an electric field perpendicular to an interface between the single crystal non-linear optical material and the first cladding layer.

According to one aspect of the invention, a dominant polarization of light entering the waveguide has an electric field parallel to an interface between the single crystal nonlinear optical material and the first cladding layer.

According to one aspect of the invention, the device further includes at least one lens optically arranged between the semiconductor laser device and the waveguide, the at least one lens configured to collect light emitted from the semiconductor laser device and focus the collected light into the waveguide.

According to one aspect of the invention, light from the laser device is directly coupled to the waveguide.

According to one aspect of the invention, the waveguide comprises a frequency-doubling ridge waveguide.

According to one aspect of the invention, the waveguide comprises a frequency-doubling planar waveguide.

According to one aspect of the invention, the waveguide comprises at least one of a frequency-doubling planar waveguide or a frequency-doubling ridge waveguide, and wherein the single crystal thin-film comprises BBO having a principal surface, and a BBO <01-10> crystal direction is less than 5 degrees from a direction perpendicular to the principal surface, and a BBO [0001] crystal direction lying in the plane of the principal surface.

According to one aspect of the invention, the device further comprises a dichroic component configured to reduce the range of wavelengths of the light emitted by the semiconductor laser device.

According to one aspect of the invention, the device further comprises a beam separation component configured to separate frequency doubled ultraviolet light from light emitted by the semiconductor laser device.

According to one aspect of the invention, the dichroic component comprises at least one of a diffraction grating oriented such that a diffracted beam from the grating passes back along a same path as light emitted from the semiconductor laser device, or a mirror having different reflectivity for different wavelengths of light.

According to one aspect of the invention, the dichroic component is at least one of optically coupled to an output of the waveguide, optically arranged between the semiconductor laser device and the waveguide, or arranged to feedback light into a facet of the semiconductor laser device.

According to one aspect of the invention, the semiconductor laser device comprises periodic structures monolithically integrated into the semiconductor laser device, the periodic structures configured to cause light emitted from the semiconductor laser device to include a smaller range of wavelengths than light emitted from a Fabry-Perot laser diode.

According to one aspect of the invention, the device further comprises a temperature controlling element coupled to the semiconductor laser device, the temperature controlling element configured to modify a temperature of the semiconductor laser device.

According to one aspect of the invention, at least one of the semiconductor laser device and the waveguide are enclosed in a hermetically sealed package and the visible and ultraviolet light is emitted through a transparent window region of the package.

According to one aspect of the invention, the first cladding region comprises a material selected from the group of materials consisting of $MgF_2$, $CaF_2$, $LaF_3AlF_3$, $GaF_3$, NOA88, CYTOP, and fluoropolymers.

According to one aspect of the invention, the cladding region has an extinction coefficient (k) less than 0.05 at the wavelength of both the visible and ultraviolet light.

According to one aspect of the invention, an ultraviolet power output of the light source is between 0.01 mW and 500 mW.

According to one aspect of the invention, the laser light source is configured to emit both ultraviolet light and visible light.

According to one aspect of the invention, the semiconductor laser device is a semiconductor laser diode.

According to one aspect of the invention, a method of forming a frequency doubling waveguide for ultraviolet light generation, the waveguide including a frequency doubling region, the method including: applying to a surface of the frequency doubling region a cladding region comprising material substantially transparent to light having wavelengths of visible and ultraviolet laser light beams; attaching the cladding region to a substrate; polishing the frequency doubling region to form a single crystal nonlinear optical material thin film; and etching the thin film so to form a ridge-type waveguide structure.

According to one aspect of the invention, etching the thin film includes using an etch mask layer made of the same material as the first cladding layer.

According to one aspect of the invention, using the etch mask layer includes retaining the etch mask layer on top of the ridge-type waveguide structure as a top coating layer.

According to one aspect of the invention, the method includes removing the etch mask layer.

According to one aspect of the invention, forming the single crystal nonlinear optical material thin film comprises forming the single crystal nonlinear optical material thin film from Beta-Barium Borate (BBO).

According to one aspect of the invention, the method includes orienting the BBO material to provide phase matched frequency-doubling for ultraviolet generation for a visible light beam in a plane of the waveguide.

According to one aspect of the invention, etching the thin film comprises using a dry etching process.

According to one aspect of the invention, the method includes depositing an additional cladding layer over the etched surface and ridge sidewalls.

According to one aspect of the invention, depositing the additional cladding layer includes using $MgF_2$ as the additional cladding layer.

According to one aspect of the invention, the method includes polishing into edges of the single-crystal non-linear optical material an entrance facet to enable light from a light source to be coupled into the ridge waveguide, and an exit facet to enable light to be out-coupled from the ridge waveguide.

According to one aspect of the invention, polishing the frequency doubling region to form a single crystal nonlinear optical material thin film includes polishing the frequency doubling region to produce a thickness variation of less than 2 micrometers in the thin film.

According to one aspect of the invention, polishing the frequency doubling region to form a single crystal nonlinear optical material thin film includes performing the polishing step in an atmosphere having a relative humidity of less than 30 percent and using fluids that are anhydrous.

According to one aspect of the invention, coefficients of thermal expansion of the substrate match those of the single crystal nonlinear optical material thin film.

According to one aspect of the invention, a method of forming a frequency doubling waveguide for ultraviolet light generation, the waveguide including a frequency doubling region, the method including: applying to a surface of the frequency doubling region a cladding region comprising material substantially transparent to light having wavelengths of visible and ultraviolet laser light beams; attaching the cladding region to a substrate; polishing the frequency doubling region to form a single crystal nonlinear optical material thin film to form a planar waveguide structure.

According to one aspect of the invention, the method includes polishing into edges of the single-crystal non-linear optical material an entrance facet to enable light from a light source to be coupled into the planar waveguide, and an exit facet to enable light to be out-coupled from the planar waveguide.

According to one aspect of the invention, the method includes coating at least one polished facet with an anti-reflection coating.

According to one aspect of the invention, the anti-reflection coating comprises $MgF_2$.

According to one aspect of the invention, forming the single crystal nonlinear optical material thin film comprises forming the single crystal nonlinear optical material thin film from Beta-Barium Borate (BBO).

According to one aspect of the invention, the method includes orienting the BBO material to provide phase matched frequency-doubling for ultraviolet generation for a visible light beam in a plane of the waveguide.

According to one aspect of the invention, the method includes depositing a cladding layer on the polished surface, the cladding layer being substantially transparent to light.

According to one aspect of the invention, polishing the frequency doubling region to form a single crystal nonlinear optical material thin film includes polishing the frequency doubling region to produce a thickness variation of less than 2 micrometers in the thin film.

According to one aspect of the invention, polishing the frequency doubling region to form a single crystal nonlinear optical material thin film includes performing the polishing step in an atmosphere having a relative humidity of less than 30 percent and using fluids that are anhydrous.

According to one aspect of the invention, coefficients of thermal expansion of the substrate match those of the single crystal nonlinear optical material thin film.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

FIG. 19 is a list of approximate preferred values of θ for different wavelengths of light emitted by the visible laser diode ($\lambda_1$)

DESCRIPTION OF REFERENCE NUMERALS

Figure 1:
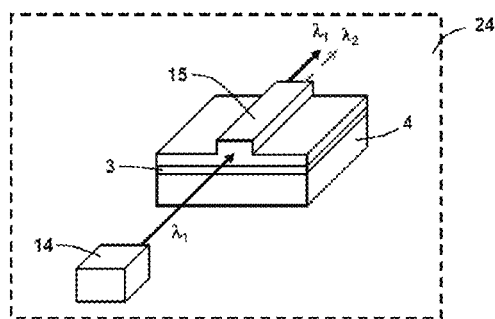
FIG. 1 is an illustration of the basic concept of an exemplary ultraviolet laser according to the invention.

1. Single crystal BBO wafer
2. First polished surface of BBO wafer
3. First cladding material
4. Supporting substrate
5. Adhesive layer
6. Second polished surface
7. Second cladding material
8. Entrance facet
9. Exit facet
10. Single crystal thin film frequency-doubling planar waveguide
11. Ridge
12. Third cladding material
13. Single crystal thin film frequency-doubling ridge waveguide
14. Semiconductor laser diode emitting visible light
15. Single crystal thin film frequency-doubling ridge waveguide
16. Lens
17. Thickness of nonlinear optical thin film
18. Length of single crystal thin film frequency-doubling waveguide
19. Width of individual frequency-doubling waveguide component
20. Height of ridge
21. Width of ridge
22. Single crystal thin film frequency-doubling planar waveguide
23. Lenses
24. Ultraviolet wavelength laser
25. Direction perpendicular to the plane of the first polished surface 26. Preferred direction for phase matching in Example 5
27. Lenses
28. Lens
29. Beam separation component
30. Dichroic component
31. DBR/DFB laser
32. Temperature-controlling element
33. Hermetically sealed enclosure around waveguide
34. Entrance window to hermetically sealed enclosure
35. Exit window from hermetically sealed enclosure
36. Hermetically sealed enclosure containing laser diode and waveguide

DETAILED DESCRIPTION OF INVENTION

The device in accordance with the present invention is a laser light source that provides at least ultraviolet light and preferably simultaneously provides both visible and ultraviolet light. The ultraviolet wavelength light is provided by frequency doubling visible laser light emitted from a semiconductor laser device, such as a semiconductor laser diode. The frequency doubling is achieved using a nonlinear optical crystal taking the form of a single-crystal thin film frequency-doubling waveguide. The laser diode emits visible light with a wavelength, $\lambda_1$, in the range 400-560 nm. Typically laser diodes emit light with a small range of wavelengths—for example a range of ±0.5 nm from a centre wavelength—but for convenience we refer to emission as occurring at a single wavelength, $\lambda_1$. The light emitted by the laser diode is optically coupled into a single crystal thin film frequency-doubling waveguide. A portion of the light with wavelength $\lambda_1$ is converted into frequency-doubled light with wavelength $\lambda_2=\lambda_1/2$. For example, if the light emitted by the laser diode has wavelength $\lambda_1=450$ nm, the frequency-doubled light has a wavelength of $\lambda_2=225$ nm, which corresponds to deep ultraviolet light. The device emits both some of the light emitted by the laser diode and some of the frequency-doubled light. The power output of the ultraviolet (frequency-doubled) light can be in the range from 0.01 mW to 500 mW.

Figure 2:
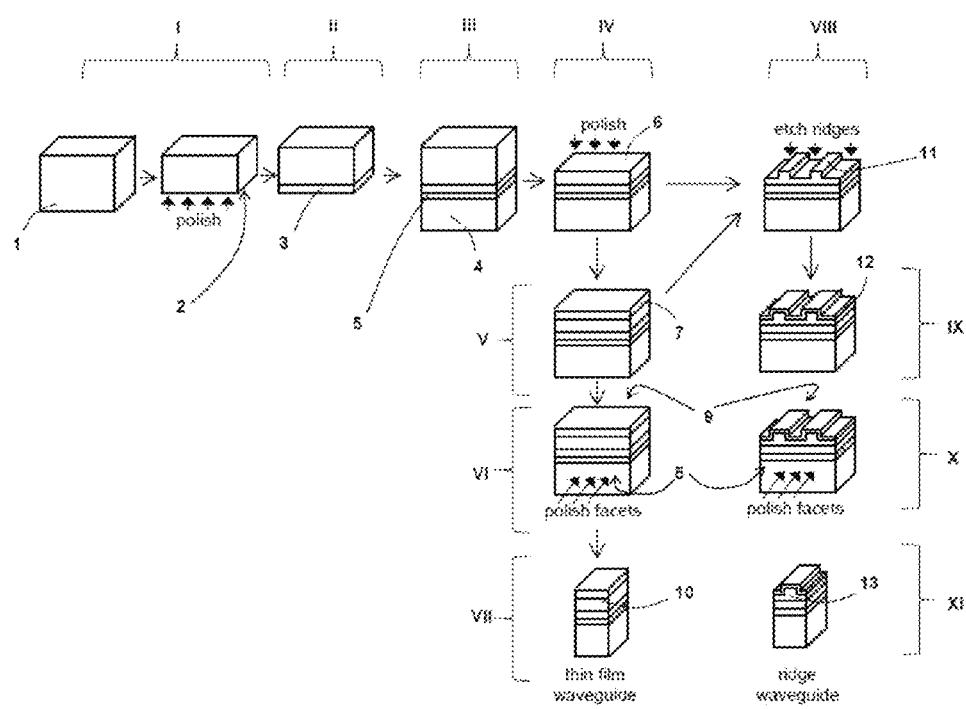
FIG. 2 is an illustration of an exemplary manufacturing process of the frequency doubling waveguide

FIG. 2 illustrates the general steps for manufacturing a frequency doubling single crystal thin-film waveguide structure from a suitable non-linear optical single crystal according to the current invention. In this example case a BBO ($\beta$-BaB$_2$O$_4$) single crystal is used as the non-linear optical single crystal. However, any other nonlinear optical single crystal may be used, providing it does not strongly absorb light emitted by the semiconductor laser diode with a wavelength, $\lambda_1$, in the range between 400 nm and 560 nm, and does not strongly absorb the frequency-doubled light with a wavelength $\lambda_2=\lambda_1/2$ in the range 200 nm to 280 nm. Examples of other nonlinear optical crystals include potassium fluoroboratoberyllate (KBe$_2$BO$_3$F$_2$; KBBF), lithium tetraborate (Li$_2$B$_4$O$_7$; LB4), lithium rubidium tetraborate (LiRbB$_4$O$_7$; LRB4) and magnesium barium fluoride (MgBaF4). Other nonlinear optical crystals not in this list could also be used. Alternatively, quasi-phasematched (QPM) frequency-doubling materials fabricated from, or deposited on, single crystals can also be used, provided they are not strongly absorbing of light with wavelength $\lambda_1$ and $\lambda_2$. For example, QPM quartz could be used.

It is preferable that the waveguide fabricated from the nonlinear optical single crystal can provide frequency-doubling with a long coherence length (at least 1 mm, and most preferably at least 20 mm). The coherence length, $L_C$, for frequency doubling is defined according to $L_C=\lambda_1/4(N_{\lambda_2}-N_{\lambda_1})$ where $\lambda_1$ is the wavelength of the light emitted by the laser diode, $N_{\lambda_1}$ is the effective refractive index of the waveguide mode that the incident light (wavelength $\lambda_1$) propagates in, and $N_{\lambda_2}$ is the effective refractive index of the waveguide mode that the frequency-doubled light (wavelength $\lambda_2=\lambda_1/2$) propagates in. It is preferred that the coherence length for frequency doubling is larger than the length of the frequency-doubling waveguide. In this disclosure we use the term "phasematched" to refer to conditions where the coherence length for frequency doubling is longer than the length of the waveguide.

The steps are as follows:

I. A commercially sourced single crystal BBO wafer 1 with typical dimensions of 9 mm×9 mm×0.5 mm (or other dimensions as required for the particular application) is mechanically lapped and polished to a mirror-like flatness on one of its principal surfaces (that is, one of the two 9 mm×9 mm surfaces). This is referred to as the first polished surface 2. The orientation of the first polished surface is chosen so that, when the waveguide fabrication is complete, the waveguide will provide phasematched frequency-doubling of light emitted by the semiconductor laser diode. Preferably, the orientation of the first polished surface is chosen so that, when the waveguide fabrication is complete, the nonlinear coefficient for frequency-doubling in the phasematched waveguide is the maximum that can be obtained from the nonlinear optical crystal for frequency doubling of light emitted by the semiconductor laser diode. Commercially available wafers may be sourced with a polished surface with the appropriate orientation, flatness and smoothness. BBO should be stored, processed and used in dry conditions as it is mildly hygroscopic. BBO is a relatively soft material so care must be taken to protect the polished surfaces from scratching and dust.

II. The polished BBO wafer is next cleaned using suitable anhydrous organic solvents to remove any debris remaining from the polishing process. At this point, the first polished surface of the BBO wafer may be coated with a first cladding material (or materials) 3 that is transparent or substantially transparent to light which will propagate along the waveguide during subsequent operation (that is, the light emitted by the laser diode (wavelength $\lambda_1$) and light generated by frequency doubling (wavelength $\lambda_2$)). Careful consideration should be given when sourcing suitable material as well as verification of low absorption at the deep UV laser wavelength $\lambda_2$ as the vast majority of potential cladding materials have high absorption at deep UV wavelengths. The first cladding material is transparent or substantially transparent to light with wavelengths $\lambda_1$ and $\lambda_2$ when the extinction coefficient (k) of the first cladding material is less than or equal to 0.05 for light with wavelengths $\lambda_1$ and $\lambda_2$. Preferably the extinction coefficient (k) is less than 0.02 for light with wavelengths $\lambda_1$ and $\lambda_2$. The extinction coefficient is a parameter to quantify the transparency of a material to light. The intensity (I) of light with wavelength $\lambda$ passing through the material varies according to $I=I_0 \exp(-4\pi xk/\lambda)$ where x is the distance the light has propagated through the material and $I_0$ is the intensity of light at x=0. Preferably, at each wavelength $\lambda_1$ and $\lambda_2$, the first cladding material will also have a refractive index (n) smaller than the refractive index of the nonlinear optical material at the same wavelength. In the case of birefringent nonlinear optical crystals, such as BBO, the relevant refractive index of the nonlinear optical material at each wavelength is the refractive index for light propagating along the phasematched direction in the final waveguide, taking account of the polarization of the light. A preferred choice for the first cladding material is magnesium fluoride ($MgF_2$) deposited by vacuum evaporation under conditions which yield k<0.02 for light with wavelength $\lambda_2$, but other suitable materials include $CaF_2$, $LaF_3AlF_3$, $GaF_3$, NOA88 (manufactured by Norland Products Inc.), CYTOP (manufactured by Asahi Glass Co. Ltd.) and fluoropolymers. The thickness of the first cladding material 3 is at least 100 nm; 500 nm is preferred.

III. Next, the BBO wafer is attached to a supporting substrate 4 of, for example, pure fused silica (PFS) using an adhesive layer 5. If the BBO wafer was previously coated on the first polished surface with a first cladding material then this surface is the bonding surface. If no first cladding material was previously applied then an adhesive cladding material 5 that is transparent or substantially transparent to light which will propagate along the waveguide during subsequent operation (wavelengths $\lambda_1$ and $\lambda_2$) is used to bond the first polished surface to the supporting substrate and becomes the first cladding material. Particular care is taken to ensure low absorption at the deep UV laser wavelength $\lambda_2$ as the vast majority of adhesives have high absorption at deep UV wavelengths. For light with wavelengths $\lambda_1$ and $\lambda_2$ the adhesive cladding material has an extinction coefficient (k) of less than 0.05, and preferably less than 0.02. Preferably, at each wavelength $\lambda_1$ and $\lambda_2$, the first cladding material will also have a refractive index (n) smaller than the refractive index of the nonlinear optical material at the same wavelength. In the case of birefringent nonlinear optical crystals, such as BBO, the relevant refractive index of the nonlinear optical material at each wavelength is the refractive index for light propagating along the phasematched direction in the final waveguide, taking account of the polarization of the light. Examples of suitable adhesives are NOA88 (manufactured by Norland Products Inc.), CYTOP (manufactured by Asahi Glass Co. Ltd.), fluoropolymers. The BBO wafer and PFS substrate may be held together using a suitable mechanical jig during the adhesive curing process to ensure the adhesive thickness stays uniform across the entire BBO surface. The supporting substrate may be chosen to have coefficients of thermal expansion which closely match the coefficients of thermal expansion of the nonlinear optical crystal, in the plane of the substrate.

Figure 3:
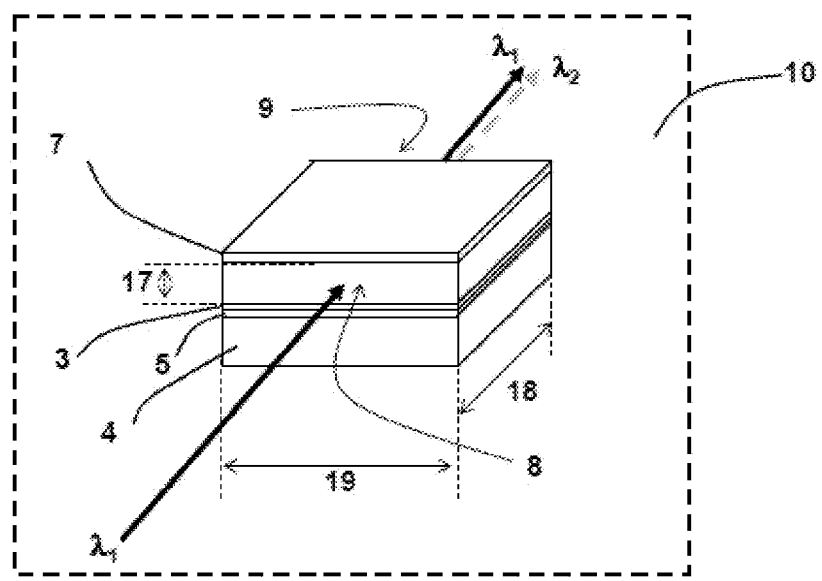
FIG. 3 is an illustration of an exemplary single crystal thin film frequency-doubling planar waveguide according to the invention

IV. The principal surface of the bonded BBO wafer which remains exposed is next mechanically lapped and polished in order to reduce its overall thickness 17 (see FIGS. 3 and 4) down from 0.5 mm to that of a thin film of less than 40 µm. This is referred to as the second polished surface 6. The thickness of the BBO thin film is the distance between the first polished surface and the second polished surface, measured along a distance perpendicular to the plane of the first polished surface. An example of equipment suitable to use for the lapping and polishing is a PP5 polishing jig and PM5 precision lapping and polishing machine both manufactured by Logitech Ltd. (UK). The mechanical lapping process can be carried out using a glass lapping plate and 9 µm aluminium oxide ($Al_2O_3$) abrasive particles dispersed in anhydrous ethylene glycol. The mechanical polishing process can be carried out using an expanded polyurethane plate and 0.3 µm aluminium oxide ($Al_2O_3$) abrasive particles dispersed in anhydrous ethylene glycol. A final BBO thin film thickness of between 1 µm and 10 µm is most preferred but any thickness of less than 40 µm provides the advantages of this invention. The mechanical lapping and polishing should be carried out under conditions of low ambient humidity to minimize the exposure of BBO to water in the air. It is preferred that the ambient relative humidity is less than 30%. It is further preferred that the lapping and polishing is carried out under entirely anhydrous conditions; for example in an atmosphere of dry nitrogen gas. The resulting BBO single crystal thin film thickness must not vary significantly along the direction that the light will propagate through the film during subsequent operation. If this thickness does vary significantly then the coherence length for frequency doubling will be reduced and the efficiency of the frequency-doubling in the thin film waveguide will be reduced. The thickness of the BBO single crystal thin film preferably varies by less than 2 µm along the direction the light propagates through the waveguide during subsequent operation, and most preferably the thickness varies by less than 0.1 µm along this direction.

V. The second polished surface is next cleaned using suitable pure anhydrous organic solvents to remove any debris remaining from the polishing process. At this stage a second cladding material 7 may be deposited on the second polished surface. This second cladding material should satisfy the same requirement of being transparent or nearly transparent to light with wavelengths $\lambda_1$ and $\lambda_2$ as described above for choice of the first cladding material. Preferably this second cladding material should also satisfy the same requirements for refractive index (n) at wavelengths $\lambda_1$ and $\lambda_2$ as for the first cladding material, as described above. $MgF_2$ is a preferred choice for the second cladding material but other suitable materials include those listed above as possible choices for the first cladding material. The second cladding material can provide protection of the BBO single crystal thin film from damage caused by water in the air during subsequent handling and processing of the thin film.

Figure 4:
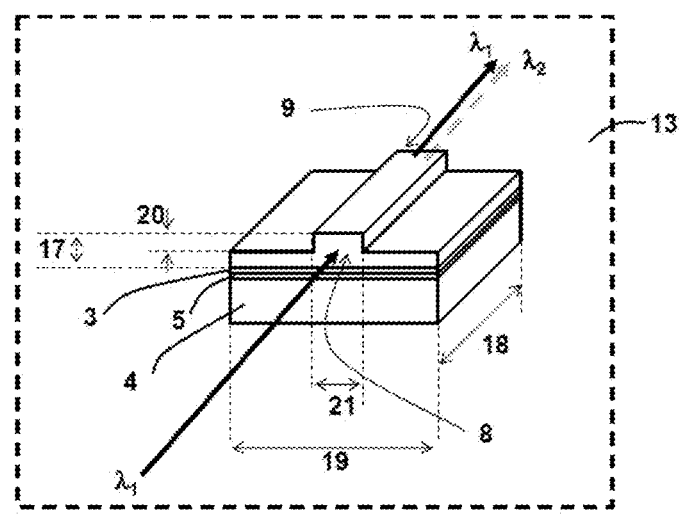
FIG. 4 is an illustration of an exemplary single crystal thin film frequency-doubling ridge waveguide according to the invention

The BBO single crystal thin film can now be processed either to form a frequency-doubling planar waveguide (shown schematically in FIG. 3; steps VI to VII below) or a frequency-doubling ridge waveguide (shown schematically in FIG. 4; steps VIII to XI below).

VI. For fabrication of a frequency-doubling planar waveguide, facets are now polished onto the edges of the single crystal thin film so that light can be coupled into and out of the waveguide. An entrance facet 8 is polished so that light from the semiconductor laser diode (wavelength $\lambda_1$) can be coupled into the waveguide. An exit facet 9 is polished so that light with wavelength $\lambda_1$ and frequency-doubled light with wavelength $\lambda_2$ can be coupled out of the waveguide. The facets are polished with orientations which enable light from the semiconductor laser diode to be coupled into the frequency-doubling planar waveguide so that the light propagates along a direction in the plane of the thin film which provides phasematched frequency-doubling. For example, the entrance and exit facets may be polished so that the direction perpendicular to the plane of the facet is approximately parallel to the phasematched direction. The distance between the entrance and exit facets, measured along the phasematched direction, will define the length 18 (FIG. 3) of the thin film planar waveguide. The entrance and exit facets may be polished using an expanded polyurethane polishing plate and 0.3 µm aluminium oxide ($Al_2O_3$) abrasive dispersed in anhydrous ethylene glycol. Optionally, neither, one or both of the polished edge facets can be coated with an anti-reflection coating. The anti-reflection coating on the entrance facet is designed to increase the transmission of light from the semiconductor laser diode (wavelength $\lambda_1$) into the waveguide. The coating on the exit facet is designed to increase the transmission of frequency-doubled light (wavelength $\lambda_2$) out of the waveguide. A single layer of $MgF_2$, deposited to a controlled thickness which maximizes transmission of the relevant wavelength (for example a "quarter wave" coating), is an example of a suitable anti-reflection coating.

VII. Finally, the wafer is diced into a plurality of thin film frequency-doubling planar waveguide components 10 each of which is suitable for use in a UV laser device.

It is preferable to form a frequency-doubling ridge waveguide rather than a frequency-doubling planar waveguide. For fabrication of a frequency-doubling ridge waveguide steps (VI) and (VII) are not carried and steps VII to XI are carried out instead. The geometry of a ridge 11 is shown in FIG. 4. The light from the semiconductor laser diode will be confined in the ridge and propagate along the direction of the ridge during operation of the final device. Therefore, the direction of the ridge is chosen so that the light from the semiconductor laser diode (wavelength $\lambda_1$) will propagate along a direction in the thin film which provides phasematched frequency-doubling to generate the frequency-doubled light with wavelength $\lambda_2 = \lambda_1/2$. With additional reference to FIG. 4, the height of the ridge 20 is measured along a direction perpendicular to the plane of the second polished surface. The width of the ridge 21 is measured along a direction perpendicular to the direction of the height and perpendicular to the direction along which the ridge propagates. The height of the ridge is chosen to be at least 0.1 μm and less than 20 μm. Preferably the height is in the range 0.5 μm-3 μm. The width of the ridge is chosen to be at least 1 μm and less than 40 μm. Preferably the width is in the range 4 μm-10 μm.

There are several different methods which can be used to provide a ridge 11 in the top surface of the BBO. An example of a method is described in step VIII.

VIII. A thin film of PMMA (for example, thickness 60 nm) is deposited onto the BBO surface. A photoresist (for example, AZ5214E) is deposited onto the PMMA layer. The photoresist is patterned using standard optical lithography and etching so that the photoresist/PMMA bilayer is completely removed where the BBO ridge is required. Next, an etch mask material is deposited onto the top surface to a thickness of more than 100 nm. Preferably, this etch mask material should satisfy the same requirement of being transparent or nearly transparent to light with wavelengths $\lambda_1$ and $\lambda_2$ as described above for choice of the first cladding material. Preferably this etch mask material should also satisfy the same requirements for refractive index (n) at wavelengths $\lambda_1$ and $\lambda_2$ as for the first cladding material, as described above. $MgF_2$ deposited by vacuum evaporation is a preferred choice for the etch mask material. A solvent lift-off process, for example using acetone, is then used to remove the PMMA/photoresist bilayer, thereby leaving stripes of etch mask material on the BBO surface. A dry etching process, for example argon ion plasma etching, is then used to remove the BBO in the regions between the etch mask material stripes until the BBO ridge assumes the target ridge height. Optionally, the etch mask material may now be removed from the surface of the ridge using an etch process. The resulting ridge-type structure, after removal of the etch mask material, is illustrated in FIG. 4.

IX. At this stage a third cladding material 12 may be deposited on top of the wafer to coat both the etched surface and the ridge sidewalls exposed in the dry etching step. This third cladding material should satisfy the same requirement of being transparent or nearly transparent to light with wavelengths $\lambda_1$ and $\lambda_2$ as described above for choice of the first cladding material. Preferably this third cladding material should also satisfy the same requirements for refractive index (n) at wavelengths $\lambda_1$ and $\lambda_2$ as for the first cladding material, as described above. $MgF_2$ is a preferred choice for the third cladding material. The third cladding material can provide protection of the BBO single crystal thin film from damage caused by water in the air during subsequent handling, processing and operation of the waveguide. The third cladding material can also reduce the scattering losses for light propagating along the ridge waveguide.

X. Next, facets are polished onto the edges of the etched single crystal thin film so that light can be coupled into and out of the ridge waveguide. An entrance facet 8 is polished so that light from the semiconductor laser diode (wavelength $\lambda_1$) can be coupled into the ridge waveguide. An exit facet 9 is polished so that light with wavelength $\lambda_1$ and frequency-doubled light with wavelength $\lambda_2$ can be coupled out of the ridge waveguide. The facets are polished with orientations which enable light from the semiconductor laser diode to be coupled into the frequency-doubling ridge waveguide so that the light propagates along the ridge waveguide. For example, the entrance and exit facets may be polished so that the direction perpendicular to the plane of the facet is approximately parallel to the direction of the ridge. The distance between the entrance and exit facets, measured along the direction of the ridge, will define the length of the thin film ridge waveguide 18. The entrance and exit facets may be polished using an expanded polyurethane polishing plate and aluminium oxide ($Al_2O_3$) abrasive dispersed in anhydrous ethylene glycol. Optionally, neither, one or both of the polished edge facets can be coated with an anti-reflection coating. The anti-reflection coating on the entrance facet is designed to increase the transmission of light from the semiconductor laser diode (wavelength $\lambda_1$) into the waveguide. The coating on the exit facet is designed to increase the transmission of frequency-doubled light (wavelength $\lambda_2$) out of the waveguide. A single layer of $MgF_2$, deposited to a controlled thickness which maximizes transmission of the relevant wavelength (for example a "quarter wave" coating), is an example of a suitable anti-reflection coating.

XI. Finally, the wafer is diced into a plurality of thin film frequency-doubling ridge waveguide components 13 each of which is suitable for use in a UV laser device.

The light emitted by the laser diode (wavelength $\lambda_1$) is coupled into the entrance facet 8 of either the planar waveguide 10 or the ridge waveguide 13, so that this incident light propagates in a waveguide mode through the nonlinear optical material which provides phasematched frequency doubling of the light. In the case of a planar waveguide, the nonlinear optical material in between the first polished surface and the second polished surface, and between the entrance facet and exit facet, constitutes the frequency-doubling region of the waveguide. In the case of a ridge waveguide, the nonlinear optical material between the first polished surface and the etched ridges, and between the entrance facet and exit facet, constitutes the frequency-doubling region of the waveguide. The light propagating along the waveguide mode of a ridge waveguide is confined immediately below, and in the vicinity of, the ridge as it passes between the entrance and exit facets and this region constitutes the frequency-doubling region of the waveguide.

The single crystal thin film frequency-doubling waveguide converts a portion of the incident light into frequency-doubled ultraviolet light with wavelength $\lambda_2 = \lambda_1/2$. Light with wavelength $\lambda_1$ and $\lambda_2$ passes out of the waveguide through the exit facet 9.

Figure 5:
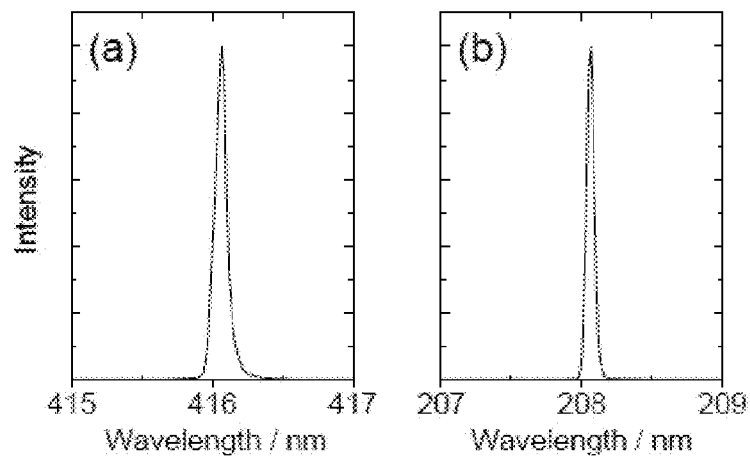
FIG. 5 is an example of the actual laser light output simultaneously provided by the invention.

The plots in FIG. 5 shows spectra the light emitted from a deep UV laser device fabricated according to one embodiment of the current invention. The plot in FIG. 5(a) shows the spectrum of the visible light emitted by the laser diode ($\lambda_1 \approx 416$ nm) and the plot in FIG. 5(b) shows the spectrum of the ultraviolet frequency-doubled light ($\lambda_2 \approx 208$ nm).

This invention offers several advantages over the prior art. The use of a laser diode emitting visible light with a single crystal thin film frequency-doubling waveguide provides a deep UV laser source with low cost and small size. The fabrication of the single crystal thin film frequency-doubling waveguide, clad with one or more materials with low absorption losses, using a lapping and polishing process starting with a bulk single crystal provides a route to a high-quality single crystal waveguide with high efficiency for deep UV light generation. In particular, disadvantages associated with fabrication of frequency-doubling waveguides using ion implantation, and without use of low-absorption cladding layers, are overcome. The deep UV light can be focused to a small spot or collimated beam, unlike existing low-cost deep UV light sources such as mercury lamps or LEDs.

Example 1

Figure 6:
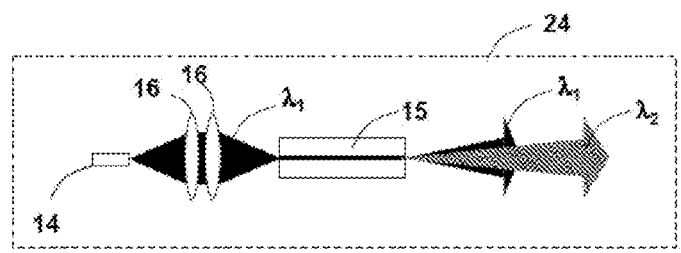
FIG. 6 is a top plan view of the component configuration of an exemplary ultraviolet laser according to the invention

The first embodiment of the present invention is now described. The laser device 24, illustrated in FIG. 6, comprises of a semiconductor laser diode 14 to generate a visible laser light with a wavelength, $\lambda_1$, in the range 400-560 nm which is coupled into a frequency doubling crystal of BBO taking the form of a single crystal thin film ridge waveguide structure 15. $\lambda_1$ is preferably in the range from 410 nm to 460 nm. The light is coupled from the laser diode 14 to the waveguide 15 using one or more lenses 16 which collect the light emitted from the laser diode 14 and focus the light into the waveguide 15. Preferably, the dominant polarization of the light entering the waveguide has the electric field perpendicular to the interface between the BBO crystal (e.g., the single crystal nonlinear optical material) and the first cladding layer. A portion of the visible light from the semiconductor laser diode is frequency-doubled in the waveguide to generate light with wavelength $\lambda_2 = \lambda_1/2$. Both visible and ultraviolet laser beams are simultaneously emitted from the frequency doubling waveguide structure.

Figure 7:
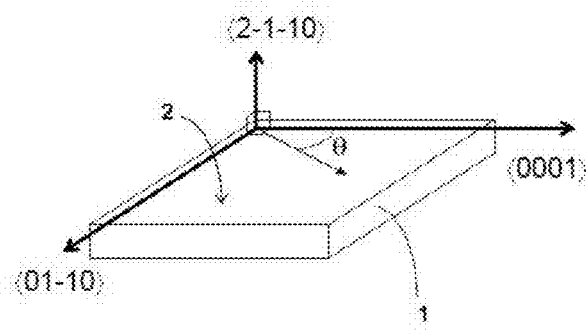
FIG. 7 is an illustration of the orientation of BBO single crystal used for one embodiment of the invention

The BBO single crystal thin film frequency doubling ridge waveguide is fabricated according to the method described in steps I to IV and VIII to XI above. Where specific details have not already been made clear in the description above they are as follows:

In step I a single crystal BBO x-cut wafer 1 with typical dimensions of 9 mm×9 mm×0.5 mm (or other dimensions as required for the particular application) is used as the nonlinear optical single crystal. x-cut BBO wafers have a BBO <2-1-10> crystal direction less than 5° from the direction perpendicular to their principal surfaces (that is the 9 mm×9 mm surfaces) and have the BBO [0001] crystal direction lying in the plane of their principal surfaces. The plane of the first polished surface 2 is less than 5° away from being parallel to a {-12-10} lattice plane of the BBO crystal (0° is preferred). The approximate relationship between the crystal directions and the first polished surface 2 of the BBO wafer 1 is indicated in FIG. 7. Commercially available BBO wafers may be sourced with the {-12-10} plane already polished to adequate flatness and smoothness. In this disclosure the crystal directions in BBO are referred to according to the convention used in the prior art. The convention is that BBO has a hexagonal crystal structure in which lattice parameters at room temperature measured parallel to <2-1-10> directions are $a = b \approx 12.53$ Å and the lattice parameter measured parallel to the <0001> direction is $c \approx 12.73$ Å and conventional lattice angles are $\alpha = \beta = 90°$ and $\gamma = 120°$.

In step II, a 300 nm thick $MgF_2$ layer deposited by vacuum evaporation is used as the first cladding layer 3. The $MgF_2$ deposition conditions are chosen to ensure that the extinction coefficient (k) and refractive index (n) of the $MgF_2$ satisfy the conditions described in step II above.

In step III, the first cladding layer surface is attached to a UV fused silica supporting substrate 4 with size 10 mm×10 mm×1 mm. NOA88 (manufactured by Norland Products Inc.) is used as the adhesive layer 5. The thickness of the adhesive layer is preferably approximately 2 μm.

In step IV, the thickness of the BBO single crystal 17 is reduced to less than 40 μm using lapping and polishing. It is preferable that the thickness is less than 10 μm and most preferable that this thickness is approximately 4 μm. The thickness of the BBO single crystal thin film preferably varies by less than 0.1 μm along the direction the light propagates through the waveguide during subsequent operation.

In step VIII, a $MgF_2$ layer with thickness of 300 nm is used as the etch mask material. The $MgF_2$ deposition conditions are chosen to ensure that the extinction coefficient (k) and refractive index (n) of the $MgF_2$ satisfy the conditions described in step II above. The BBO is etched using argon ions in an inductively coupled plasma etching tool. The width of the ridge is less than 40 μm. It is preferable that the width of the ridge is less than 10 μm and most preferable that the width of the ridge is approximately 4 μm. The height of the ridge is at least 0.5 μm and is preferably in the range 0.5 μm to 3 μm and most preferably approximately 2 μm. The direction of the ridge is chosen so that phasematching will be satisfied for light emitted by the semiconductor laser diode propagating through the resulting ridge waveguide. The angle (θ) between the ridge and the [0001] direction in the BBO crystal will depend on the wavelength of the semiconductor laser diode. FIG. 19 provides a list of illustrative preferred examples for approximate values of θ for some possible wavelengths of the light emitted by the semiconductor laser diode ($\lambda_1$). An approximate phenomenological equation which can be used to calculate the preferred value of θ (measured in degrees) for any wavelength of the semiconductor laser diode $\lambda_1$ (measured in nm) is:

$$\theta = a_5\lambda_1^5 + a_4\lambda_1^4 + a_3\lambda_1^3 + a_2\lambda_1^2 + a_1\lambda_1 + a_0$$

wherein if 410 nm $\leq \lambda_1 <$ 411 nm, $a_5 = 0$;
$a_4 = 0.188102808664553$, $a_3 = -309.194840804581$,
$a_2 = 190590.522011723$, $a_1 = -52214207.6963821$,
$a_0 = 5364240308.25265$.

and if 411 nm $\leq \lambda_1 \leq$ 440 nm, $a_5 = -0.000001760705106$,
$a_4 = 0.00377476277753$, $a_3 = -3.23698468941742$,
$a_2 = 1387.88016707932$, $a_1 = -297527.230809678$,
$a_0 = 25512902.6041867$.

and if 440 nm<$\lambda_1$≤560 nm, $a_5$=−0.000000000333886, $a_4$=0.000000873625719, $a_3$=−0.000916331528884, $a_2$=0.482130839856291, $a_1$=−127.52288219078, $a_0$=13654.8448727922.

Preferably the angle between the ridge and the [0001] direction in the BBO crystal will be within 3° of the θ value listed in FIG. 19 or calculated using the phenomenological equation to obtain phasematching of light with wavelength $\lambda_1$. Although these values provide an indication of the direction of the ridge, the specific requirement is that the direction of the ridge should provide phasematching of the light emitted from the semiconductor laser diode and the angle of the ridge may be different from the values in these examples. The direction of the [0001] direction in the BBO crystal can be determined using X-ray diffraction.

In step IX, a $MgF_2$ layer with thickness 200 nm is used as the third cladding material 12. The $MgF_2$ deposition conditions are chosen to ensure that the extinction coefficient (k) and refractive index (n) of the $MgF_2$ satisfy the conditions described in step II above.

In step X, the entrance facet 8 and exit facet 9 can be polished at any orientation relative to the direction of the ridge. It is preferred that the facets are approximately perpendicular to the direction of the ridge.

In step XI, the width of the individual waveguide component 19 is between 0.2 mm and 5 mm and is preferably approximately 1 mm.

Example 2

Figure 8:
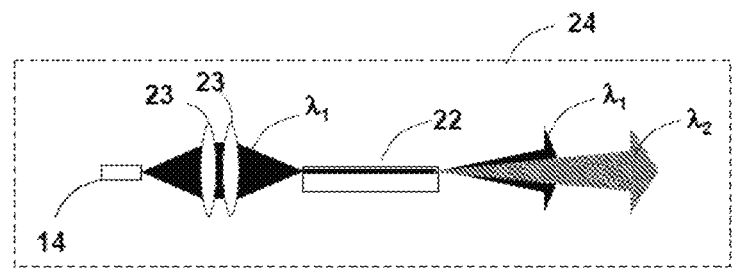
FIG. 8 is a side view of the component configuration of an ultraviolet laser according to an embodiment of the invention

A second embodiment of the present invention is now described. The laser device 24, illustrated in FIG. 8, comprises of a semiconductor laser diode 14 to generate a visible laser light with a wavelength, $\lambda_1$, in the range 400-560 nm which is coupled into a frequency doubling crystal of BBO taking the form of a single crystal thin film planar waveguide structure 22. $\lambda_1$ is preferably in the range from 410 nm to 460 nm. The light is coupled from the laser diode 14 to the waveguide 22 using one or more lenses 23 which collect the light emitted from the laser diode 14 and focus the light into the waveguide 22. Preferably, the dominant polarization of the light entering the waveguide has the electric field perpendicular to the interface between the BBO crystal (e.g., the single crystal nonlinear optical material) and the first cladding layer. A portion of the visible light from the semiconductor laser diode is frequency-doubled in the waveguide to generate light with wavelength $\lambda_2=\lambda_1/2$. Both visible and ultraviolet laser beams are simultaneously emitted from the frequency doubling waveguide structure.

The BBO single crystal thin film frequency doubling planar waveguide is fabricated according to the method described in steps I to VII above. Where specific details have not already been made clear in the description above they are as follows:

In step I a single crystal BBO x-cut wafer 1 with typical dimensions of 9 mm×9 mm×0.5 mm (or other dimensions as required for the particular application) is used as the nonlinear optical single crystal. x-cut BBO wafers have a BBO <2-1-10> crystal direction less than 5° from the direction perpendicular to their principal surfaces (that is the 9 mm×9 mm surfaces) and have the BBO [0001] crystal direction lying in the plane of their principal surfaces. The plane of the first polished surface 2 is less than 5° away from being parallel to a {−12-10} lattice plane of the BBO crystal (0° is preferred). The approximate relationship between the crystal directions and the first polished surface 2 of the BBO wafer 1 is indicated in FIG. 7. Commercially available BBO wafers may be sourced with the {−12-10} plane already polished to adequate flatness and smoothness.

In step II, a 300 nm thick $MgF_2$ layer deposited by vacuum evaporation is used as the first cladding layer 3. The $MgF_2$ deposition conditions are chosen to ensure that the extinction coefficient (k) and refractive index (n) of the $MgF_2$ satisfy the conditions described in step II above.

In step III, the first cladding layer surface is attached to a UV fused silica supporting substrate 4 with size 10 mm×10 mm×1 mm. NOA88 (manufactured by Norland Products Inc.) is used as the adhesive layer 5. The thickness of the adhesive layer is preferably ~2 μm.

In step IV, the thickness 17 of the BBO single crystal is reduced to less than 40 μm using lapping and polishing. It is preferable that the thickness is less than 10 μm and most preferable that this thickness is approximately 4 μm. The thickness of the BBO single crystal thin film preferably varies by less than 0.1 μm along the direction the light propagates through the waveguide during subsequent operation. As a result of the above steps, a direction along which the single-crystal non-linear optical material has a thickness less than 40 μm lies is less than 5° away from a <2-1-10> BBO crystal direction.

In step V, a 200 nm thick $MgF_2$ layer deposited by vacuum evaporation is used as the second cladding layer 7. The $MgF_2$ deposition conditions are chosen to ensure that the extinction coefficient (k) and refractive index (n) of the $MgF_2$ satisfy the conditions described in step II above.

In step VI, the entrance facet 8 and exit facet 9 can be polished at any orientation. It is preferred that the facets are polished approximately perpendicular to the direction of propagation through the planar waveguide which provides phasematched frequency doubling for light emitted by the semiconductor laser diode. The angle (θ) between the phasematched direction and the [0001] direction in the BBO crystal will depend on the wavelength of the semiconductor laser diode. FIG. 19 provides a list of illustrative preferred examples for approximate values of θ for some possible wavelengths of the light emitted by the semiconductor laser diode ($\lambda_1$). The approximate phenomenological equation given in Example 1 can also be used to calculate preferred values of θ. Preferably the angle between the phasematched direction and the [0001] direction in the BBO crystal will be within 3° of the θ value listed in FIG. 19 or calculated using the phenomenological equation. These values provide an indication of the phasematched direction but the actual angle may be different.

In step VII, the width of the individual waveguide component 19 is between 0.2 mm and 5 mm and is preferably approximately 1 mm Example 3

Figure 9:
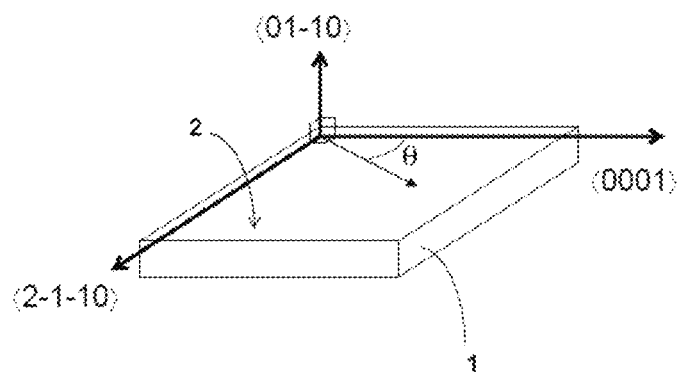
FIG. 9 is an illustration of the orientation of BBO single crystal used for another embodiment of the invention

A third embodiment of the present invention is now described. The laser device is the same as described for Example 1 except for the orientation of the BBO wafer used in step I of the waveguide fabrication. In this embodiment a single crystal BBO wafer 1 with typical dimensions of 9 mm×9 mm×0.5 mm (or other dimensions as required for the particular application) is used as the nonlinear optical single crystal. The BBO wafer has a BBO <01-10> crystal direction less than 5° from the direction perpendicular to its principal surfaces (that is the 9 mm×9 mm surfaces) and has the BBO [0001] crystal direction lying in the plane of its principal surfaces. The plane of the first polished surface 2 is less than 5° away from being parallel to a {1-100} lattice plane of the BBO crystal (0° is preferred). The approximate relationship between the crystal directions and the first polished surface 2 of the BBO wafer 1 is indicated in FIG. 9. Commercially available BBO wafers may be sourced with the {1-100} plane already polished to adequate flatness and smoothness. The remainder of the ridge waveguide fabrication process is the same as described for the first embodiment.

Example 4

The fourth embodiment of the present invention is now described. The laser device 24 illustrated in FIG. 6, comprises of a semiconductor laser diode 14 to generate a visible laser light with a wavelength, $\lambda_1$, in the range 400-560 nm which is coupled into a frequency doubling crystal of BBO taking the form of a single crystal thin film ridge waveguide structure 15. $\lambda_1$ is preferably in the range from 410 nm to 460 nm. The light is coupled from the laser diode 14 to the waveguide 15 using one or more lenses 16 which collect the light emitted from the laser diode 14 and focus the light into the waveguide 15. Preferably, the dominant polarization of the light entering the waveguide has the electric field parallel to the interface between the BBO crystal (e.g., the single crystal nonlinear optical material) and the first cladding layer. A portion of the visible light from the semiconductor laser diode is frequency-doubled in the waveguide to generate light with wavelength $\lambda_2=\lambda_1/2$. Both visible and ultraviolet laser beams are simultaneously emitted from the frequency doubling waveguide structure.

The BBO single crystal thin film frequency-doubling ridge waveguide is fabricated similarly to the single crystal thin film frequency-doubling ridge waveguide described in Example 1 except for the orientation of the BBO crystal used in step I and the direction of the ridge in step VIII.

Figure 10:
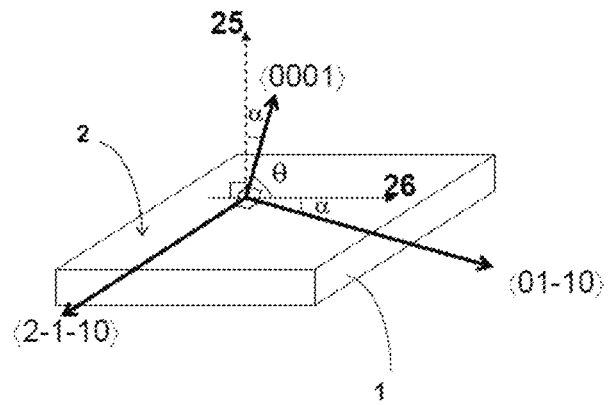
FIG. 10 is an illustration of the orientation of BBO single crystal used for yet another embodiment of the invention
Figure 11:
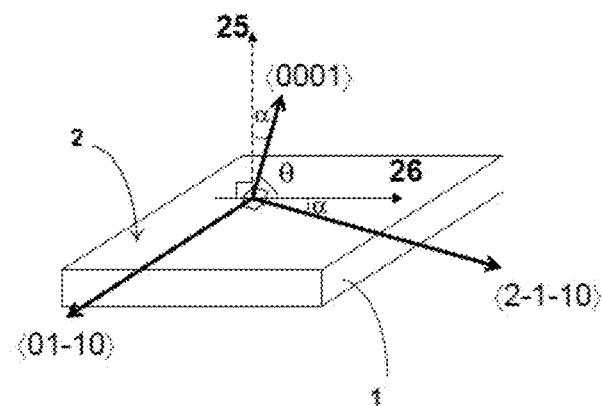
FIG. 11 is an illustration of the orientation of BBO single crystal used for yet another embodiment of the invention

In step I a single crystal BBO wafer 1 with typical dimensions of 9 mm×9 mm×0.5 mm (or other dimensions as required for the particular application) is used as the nonlinear optical single crystal. The direction 25 perpendicular to the plane of the first polished surface 2 of the BBO wafer is within 3° of an angle $\alpha=(90-\theta)°$ from the [0001] direction of the BBO crystal. Preferably the direction 25 perpendicular to the plane of the first polished surface 2 of the BBO wafer is within 5° of being perpendicular to a <2-1-10> direction in the BBO crystal (the relationship between the crystal directions and the first polished surface 2 of the BBO wafer for this preferred case is shown in FIG. 10). Alternatively, the direction 25 perpendicular to the plane of the first polished surface 2 of the BBO wafer may be within 5° of being perpendicular to a <01-10> direction in the BBO crystal (the relationship between the crystal directions and the first polished surface 2 of the BBO wafer for this case is shown in FIG. 11). Although these two specific examples have been given (that is, FIG. 10 and FIG. 11), any orientation may be used in this embodiment provided that the direction perpendicular to the plane of the first polished surface of the BBO wafer is within 3° of an angle $\alpha=(90-\theta)°$ from the [0001] direction of the BBO crystal.

The value of $\theta$ is chosen so that the resulting ridge waveguide will provide phasematched frequency doubling of light emitted by the semiconductor laser diode. The value of $\theta$ will depend on the wavelength of light emitted by the laser diode. FIG. 19 provides a list of illustrative preferred examples for approximate values of $\theta$ for some possible wavelengths of the light emitted by the semiconductor laser diode ($\lambda_1$). The approximate phenomenological equation given in Example 1 can also be used to calculate preferred values of $\theta$. Although these values provide an indication of the orientation of the polished surface, the specific requirement is only that resulting ridge waveguide will provide phasematched frequency doubling and value of $\theta$ may be different from the values in these examples.

In step VIII, the direction of the ridge is chosen so that phasematched frequency doubling will be provided for light emitted by the laser diode propagating through the resulting ridge waveguide. It is preferred that the direction of the ridge will be within 2° of the direction defined by the intersection of the plane containing both the direction perpendicular to the plane of the first polished surface and the [0001] direction of the BBO crystal and the plane of the first polished surface. For the case of the examples of BBO orientation in FIGS. 10 and 11, this direction 26 is labeled.

Example 5

A fifth embodiment of the present invention is now described. The laser device 24, illustrated in FIG. 8, comprises of a semiconductor laser diode 14 to generate a visible laser light with a wavelength, $\lambda_1$, in the range 400-560 nm which is coupled into a frequency doubling crystal of BBO taking the form of a single crystal thin film planar waveguide structure 22. $\lambda_1$ is preferably in the range from 410 nm to 460 nm. The light is coupled from the laser diode 14 to the waveguide 22 using one or more lenses 23 which collect the light emitted from the laser diode 14 and focus the light into the waveguide 22. Preferably, the dominant polarization of the light entering the waveguide has the electric field parallel to the interface between the BBO crystal (e.g., the single crystal nonlinear optical material) and the first cladding layer. A portion of the visible light from the semiconductor laser diode is frequency-doubled in the waveguide to generate light with wavelength $\lambda_2=\lambda_1/2$. Both visible and ultraviolet laser beams are simultaneously emitted from the frequency doubling waveguide structure.

The BBO single crystal thin film frequency-doubling planar waveguide is fabricated similarly to the single crystal thin film frequency-doubling planar waveguide described in Example 2 except for the orientation of the BBO crystal used in step I and the orientation of the facets polished in step VI.

In step I a single crystal BBO wafer 1 with typical dimensions of 9 mm×9 mm×0.5 mm (or other dimensions as required for the particular application) is used as the nonlinear optical single crystal. The direction 25 perpendicular to the plane of the first polished surface 2 of the BBO wafer is within 3° of an angle $\alpha=(90-\theta)°$ from the [0001] direction of the BBO crystal. Preferably the direction 25 perpendicular to the plane of the first polished surface 2 of the BBO wafer is within 5° of being perpendicular to a <2-1-10> direction in the BBO crystal (the relationship between the crystal directions and the first polished surface 2 of the BBO wafer for this preferred case is shown in FIG. 10). Alternatively, the direction 25 perpendicular to the plane of the first polished surface 2 of the BBO wafer may be within 5° of being perpendicular to a <01-10> direction in the BBO crystal (the relationship between the crystal directions and the first polished surface 2 of the BBO wafer for this case is shown in FIG. 11). Although these two specific examples have been given, any orientation may be used in this embodiment provided that the direction perpendicular to the plane of the first polished surface of the BBO wafer is within 3° of an angle $\alpha=(90-\theta)°$ from the [0001] direction of the BBO crystal.

The value of $\theta$ is chosen so that the resulting planar waveguide will provide phasematched frequency doubling of light emitted by the semiconductor laser diode. The value of $\theta$ will depend on the wavelength of light emitted by the laser diode. FIG. 19 provides a list of illustrative preferred examples for approximate values of θ for some possible wavelengths of the light emitted by the semiconductor laser diode ($\lambda_1$). The approximate phenomenological equation given in Example 1 can also be used to calculate preferred values of θ.

Although these values provide an indication of the orientation of the polished surface, the specific requirement is only that resulting planar waveguide will provide phasematched frequency doubling and value of θ may be different from the values in these examples.

In step VI, the entrance facet 8 and exit facet 9 can be polished at any orientation. It is preferred that the facets are polished approximately perpendicular to the direction of propagation through the planar waveguide which provides phasematched frequency doubling for light emitted by the semiconductor laser diode. It is preferred that the direction of propagation through the planar waveguide will be within 2° of the direction defined by the intersection of the plane containing both the direction perpendicular to the plane of the first polished surface and the [0001] direction of the BBO crystal and the plane of the first polished surface. For the case of the examples of BBO orientation in FIGS. 10 and 11, this direction 26 is labeled.

Example 6

Figure 12:
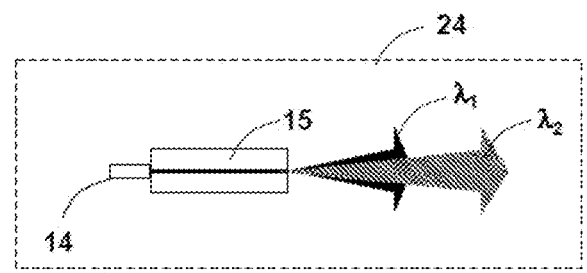
FIG. 12 is a top plan view of the component configuration of an ultraviolet laser according to an embodiment of the invention

The sixth embodiment of the present invention is now described. The laser device 24, illustrated in FIG. 12, comprises of a semiconductor laser diode 14 to generate a visible laser light with a wavelength, $\lambda_1$, in the range 400-560 nm which is coupled into a frequency doubling crystal of BBO taking the form of a single crystal thin film ridge waveguide structure 15. $\lambda_1$ is preferably in the range from 410 nm to 460 nm.

The light is coupled directly from the laser diode 14 to the waveguide 15 through placement of the emission facet of the laser diode very close to, or in contact with, the entrance facet of the waveguide. We refer to this as a "proximity-coupled" device. An advantage of the proximity-coupled structure is that it does not require lenses to couple light from the laser diode to the waveguide.

The ridge waveguide structure and fabrication is the same as described for Example 1. Preferably, the dominant polarization of the light entering the waveguide has the electric field perpendicular to the interface between the BBO crystal (e.g., the single crystal nonlinear optical material) and the first cladding layer. A portion of the visible light from the semiconductor laser diode is frequency-doubled in the waveguide to generate light with wavelength $\lambda_2=\lambda_1/2$. Both visible and ultraviolet laser beams are simultaneously emitted from the frequency doubling waveguide structure.

Example 7

The seventh embodiment of the present invention is now described. The laser device 24, illustrated in FIG. 12, comprises of a semiconductor laser diode 14 to generate a visible laser light with a wavelength, $\lambda_1$, in the range 400-560 nm which is coupled into a frequency doubling crystal of BBO taking the form of a single crystal thin film ridge waveguide structure 15. $\lambda_1$ is preferably in the range from 410 nm to 460 nm.

The light is coupled directly from the laser diode 14 to the waveguide 15 through placement of the emission facet of the laser diode very close to, or in contact with, the entrance facet of the waveguide. We refer to this as a "proximity-coupled" device.

The ridge waveguide structure and fabrication is the same as described for Example 4. Preferably, the dominant polarization of the light entering the waveguide has the electric field parallel to the interface between the BBO crystal (e.g., the single crystal nonlinear optical material) and the first cladding layer. This structure can allow simple and low cost proximity coupling for laser diodes which emit light with a dominant polarization parallel to their substrate plane (that is laser diodes emitting transverse electric, or TE, modes). A portion of the visible light from the semiconductor laser diode is frequency-doubled in the waveguide to generate light with wavelength $\lambda_2=\lambda_1/2$. Both visible and ultraviolet laser beams are simultaneously emitted from the frequency doubling waveguide structure.

Example 8

The eighth embodiment of the present invention is now described. The laser device 24, illustrated in FIG. 13, comprises of a semiconductor laser diode 14 to generate a visible laser light with a wavelength, $\lambda_1$, in the range 400-560 nm which is coupled into a frequency doubling crystal of BBO taking the form of a single crystal thin film ridge waveguide structure 15. $\lambda_1$ is preferably in the range from 410 nm to 460 nm. The light is coupled from the laser diode 14 to the waveguide 15 using one or more lenses 27 which collect the light emitted from the laser diode 14 and focus the light into the waveguide 15. Preferably, the dominant polarization of the light entering the waveguide has the electric field perpendicular to the interface between the BBO crystal (e.g., the single crystal nonlinear optical material) and the first cladding layer. The ridge waveguide structure and fabrication is the same as described for Example 1. A portion of the visible light from the semiconductor laser diode is frequency-doubled in the waveguide to generate light with wavelength $\lambda_2=\lambda_1/2$. Both visible and ultraviolet laser beams are simultaneously emitted from the frequency doubling waveguide structure.

A dichroic component 30 is used to reduce the range of wavelengths in the light emitted by the semiconductor laser diode via optical feedback. A narrower range of wavelengths results in more efficient frequency-doubling in the waveguide 15 because more of the incident light is at the wavelength which delivers most efficient frequency-doubling. Additionally the dichroic component 30 can be used to cause the laser diode to emit light with a specific wavelength. This function can be used to ensure the light emitted by the laser diode is at the wavelength which delivers most efficient frequency-doubling in the waveguide 15.

The frequency-doubled ultraviolet light is separated from the light emitted by the laser diode using a beam separation component 29. The beam separation component 29 may be a mirror which had higher reflectivity for the frequency-doubled light than for the light emitted by the laser diode 14, and receives light emitted by the ridge waveguide structure 15 via one or more lenses 28, which collect the light emitted from the waveguide 15 and focus, or collimate, the light into the beam separation component 29.

In one example, the dichroic component 30 is a diffraction grating oriented so that a diffracted beam from the grating (for example the first order diffracted beam) passes back along the same path as the light emitted from the laser diode. The strength of light fed back to the laser diode is different for different wavelengths, owing to the dispersion of the diffraction grating. The feedback causes the range of wavelengths emitted by the laser diode to be reduced. By rotation of the diffraction grating the wavelength of light emitted from the laser diode can be varied.

In another example the dichroic component 30 is a mirror which has different reflectivity at different wavelengths. For example the mirror may be a Distributed Bragg Reflector (DBR) mirror.

Figure 13:
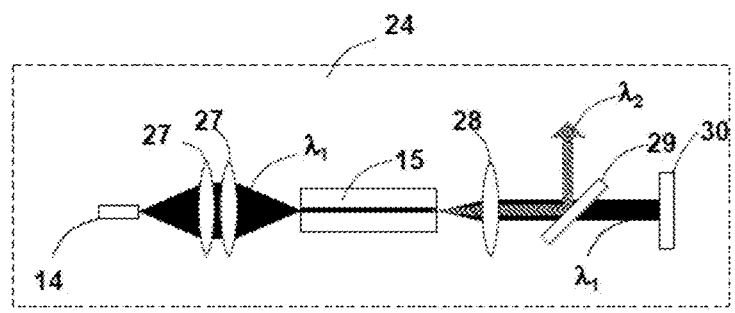
FIG. 13 is a top plan view of the component configuration of an ultraviolet laser according to an embodiment of the invention

In the example in FIG. 13 the light is incident on the dichroic component 30 after it has passed through the waveguide 15. This is the preferred condition. However, the dichroic component 30 can also be positioned in the light path between the laser diode 14 and the waveguide 15.

Figure 14:
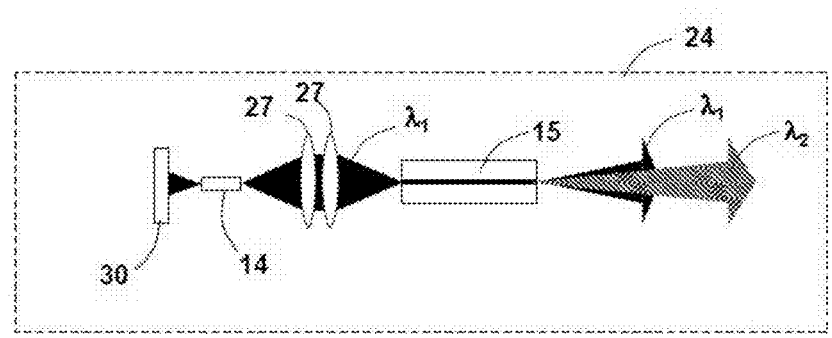
FIG. 14 is a top plan view of the component configuration of an ultraviolet laser according to an embodiment of the invention

In a further alternative, a dichroic component 30 can be positioned to feedback light into the "rear" facet if the laser diode, as shown in FIG. 14.

Example 9

Figure 15:
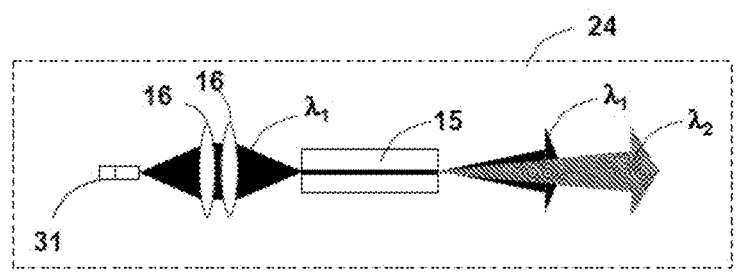
FIG. 15 is a top plan view of the component configuration of an ultraviolet laser according to an embodiment of the invention

The ninth embodiment of the present invention is now described. The laser device 24, illustrated in FIG. 15, comprises of a semiconductor laser diode 31 to generate a visible laser light with a wavelength, $\lambda_1$, in the range 400-560 nm which is coupled into a frequency doubling crystal of BBO taking the form of a single crystal thin film ridge waveguide structure 15. $\lambda_1$ is preferably in the range from 410 nm to 460 nm. The laser diode 31 is a laser diode which contains periodic structures monolithically integrated onto the laser chip which are designed to cause light emitted from the laser diode to have a smaller range of wavelengths than the light emitted from a conventional Fabry-Perot laser diode. Additionally, in some examples of this type of laser diode the emission wavelength can be adjusted during operation by application of a voltage to a portion of the laser chip.

Examples of this type of laser 31 are Distributed Feedback laser diodes (DFB laser diodes), Distributed Bragg Reflector laser diodes (DBR laser diodes) and Discrete Mode laser diodes (DM laser diodes). The light is coupled from the laser diode 31 to the waveguide 15 using one or more lenses 16 which collect the light emitted from the laser diode 31 and focus the light into the waveguide 15. The ridge waveguide structure and fabrication is the same as described for Example 1. Preferably, the dominant polarization of the light entering the waveguide has the electric field perpendicular to the interface between the BBO crystal (e.g., the single crystal nonlinear optical material) and the first cladding layer. A portion of the visible light from the semiconductor laser diode is frequency-doubled in the waveguide to generate light with wavelength $\lambda_2=\lambda_1/2$. Both visible and ultraviolet laser beams are simultaneously emitted from the frequency doubling waveguide structure.

The narrow range of wavelengths emitted by the laser diode 31 results in more efficient frequency-doubling in the waveguide 15 because more of the incident light is at the wavelength which delivers most efficient frequency-doubling. Additionally, if the emission wavelength from the laser diode 31 is adjusted during operation, the wavelength can be varied to ensure the light emitted by the laser diode 31 is at the wavelength which delivers most efficient frequency-doubling in the waveguide 15.

Example 10

Figure 16:
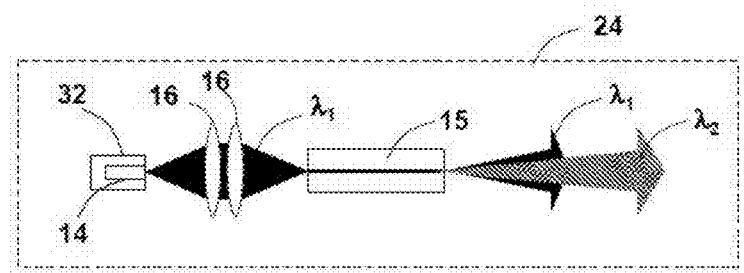
FIG. 16 is a top plan view of the component configuration of an ultraviolet laser according to an embodiment of the invention

The tenth embodiment of the present invention is now described. The laser device 24, illustrated in FIG. 16, comprises of a semiconductor laser diode 14 to generate a visible laser light with a wavelength, $\lambda_1$, in the range 400-560 nm which is coupled into a frequency doubling crystal of BBO taking the form of a single crystal thin film ridge waveguide structure 15. $\lambda_1$ is preferably in the range from 410 nm to 460 nm. The light is coupled from the laser diode 14 to the waveguide 15 using one or more lenses 16 which collect the light emitted from the laser diode 14 and focus the light into the waveguide 16. The ridge waveguide structure and fabrication is the same as described for Example 1. Preferably, the dominant polarization of the light entering the waveguide has the electric field perpendicular to the interface between the BBO crystal (e.g., the single crystal nonlinear optical material) and the first cladding layer. A portion of the visible light from the semiconductor laser diode is frequency-doubled in the waveguide to generate light with wavelength $\lambda_2=\lambda_1/2$. Both visible and ultraviolet laser beams are simultaneously emitted from the frequency doubling waveguide structure.

The laser diode is mounted on a temperature-controlling element 32 which can be used to modify the temperature of the laser diode chip during operation of the laser device 24. Through changing the temperature of the laser diode chip the emission wavelength of the laser diode can be adjusted so that the wavelength matches the wavelength which obtains most efficient frequency-doubling in the waveguide 15.

Example 11

Figure 17:
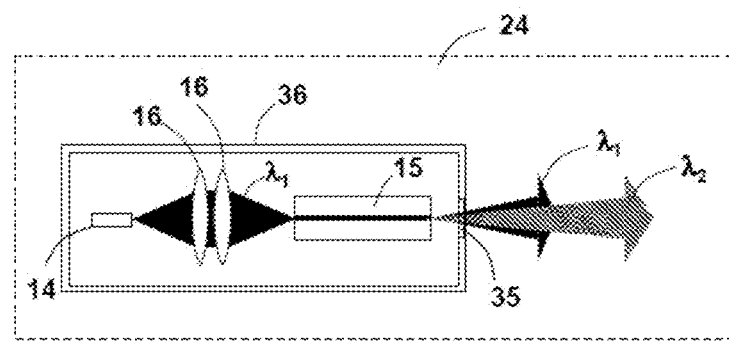
FIG. 17 is a top plan view of the component configuration of an ultraviolet laser according to an embodiment of the invention

The eleventh embodiment of the present invention is now described. The laser device 24, illustrated in FIG. 17, comprises of a semiconductor laser diode 14 to generate a visible laser light with a wavelength, $\lambda_1$, in the range 400-560 nm which is coupled into a frequency doubling crystal of BBO taking the form of a single crystal thin film ridge waveguide structure 15. $\lambda_1$ is preferably in the range from 410 nm to 460 nm. The light is coupled from the laser diode 14 to the waveguide 15 using one or more lenses 16 which collect the light emitted from the laser diode 14 and focus the light into the waveguide 15. The ridge waveguide structure and fabrication is the same as described for Example 1. Preferably, the dominant polarization of the light entering the waveguide has the electric field perpendicular to the interface between the BBO crystal (e.g., the single crystal nonlinear optical material) and the first cladding layer. A portion of the visible light from the semiconductor laser diode is frequency-doubled in the waveguide to generate light with wavelength $\lambda_2=\lambda_1/2$. Both visible and ultraviolet laser beams are simultaneously emitted from the frequency doubling waveguide structure.

The laser diode 14 and waveguide 15 are enclosed in a hermetically sealed package 36 which prevents ingress of moisture from the air. It is preferred that the hermetically sealed package is filled with dry (i.e. containing little or no water vapor) nitrogen gas during manufacturing but other dry gases can be used as alternatives. In a further alternative the package may be evacuated to low pressure and then sealed under vacuum.

Figure 18:
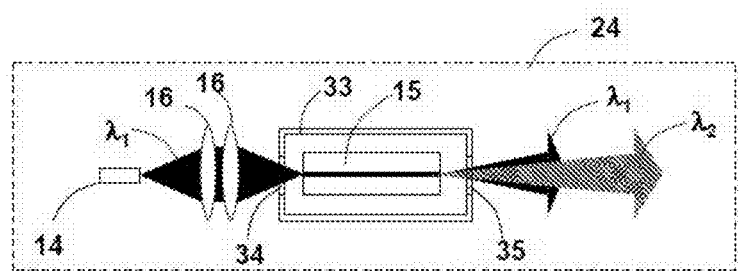
FIG. 18 is a top plan view of the component configuration of an ultraviolet laser according to an embodiment of the invention

A window 35 is provided in the hermetically sealed package through which the light from the semiconductor laser diode and the frequency-doubled UV light passes out of the package. In a second example, shown in FIG. 18, the waveguide 15 is sealed independently in a hermetically sealed package and a second entrance window 34 is provided through which light from the laser diode passes in towards the waveguide.

The hermetically sealed package prevents moisture from reaching the BBO waveguide and reduces contamination of surfaces caused by reaction of UV light on molecules in the air and thereby increases the lifetime of the UV laser device.

Although the invention has been shown and described with respect to a certain embodiment or embodiments, equivalent alterations and modifications may occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein exemplary embodiment or embodiments of the invention. In addition, while a particular feature of the invention may have been described above with respect to only one or more of several embodiments, such feature may be combined with one or more other features of the other embodiments, as may be desired and advantageous for any given or particular application.

INDUSTRIAL APPLICABILITY

The ultraviolet laser in accordance with the present invention may be used as the light source in products designed for the germicidal treatment of water. The ultraviolet laser in accordance with the present invention may also be used as a light source in fluorescence sensors.

What is claimed is:

1. A method of forming a frequency doubling waveguide for ultraviolet light generation, the waveguide including a frequency doubling region, the method comprising:
    applying to a surface of the frequency doubling region a cladding region comprising material substantially transparent to light having wavelengths of visible and ultraviolet laser light beams;
    attaching the cladding region to a substrate;
    polishing the frequency doubling region to form a single crystal nonlinear optical material thin film; and
    etching the thin film so to form a ridge-type waveguide structure.

2. The method according to claim 1, wherein etching the thin film includes using an etch mask layer made of the same material as the first cladding layer.

3. The method according to claim 2, wherein using the etch mask layer includes retaining the etch mask layer on top of the ridge-type waveguide structure as a top coating layer.

4. The method according to claim 1, wherein forming the single crystal nonlinear optical material thin film comprises forming the single crystal nonlinear optical material thin film from Beta-Barium Borate (BBO).

5. The method according to claim 4, further comprising orienting the BBO material to provide phase matched frequency-doubling for ultraviolet generation for a visible light beam in a plane of the waveguide.

6. The method according to claim 1, wherein etching the thin film comprises using a dry etching process.

7. The method according to claim 1, further comprising depositing an additional cladding layer over the etched surface and ridge sidewalls.

8. The method according to claim 7, wherein depositing the additional cladding layer includes using $MgF_2$ as the additional cladding layer.

9. The method according to claim 1, further comprising polishing into edges of the single-crystal non-linear optical material an entrance facet to enable light from a light source to be coupled into the ridge waveguide, and an exit facet to enable light to be out-coupled from the ridge waveguide.

10. The method according to claim 1, wherein polishing the frequency doubling region to form a single crystal nonlinear optical material thin film includes polishing the frequency doubling region to produce a thickness variation of less than 2 micrometers in the thin film.

11. The method according to claim 1, wherein polishing the frequency doubling region to form a single crystal nonlinear optical material thin film includes performing the polishing step in an atmosphere having a relative humidity of less than 30 percent and using fluids that are anhydrous.

12. The method according to claim 1, wherein coefficients of thermal expansion of the substrate match those of the single crystal nonlinear optical material thin film.

13. A method of forming a frequency doubling waveguide for ultraviolet light generation, the waveguide including a frequency doubling region, the method comprising:
    applying to a surface of the frequency doubling region a cladding region comprising material substantially transparent to light having wavelengths of visible and ultraviolet laser light beams;
    attaching the cladding region to a substrate;
    polishing the frequency doubling region to form a single crystal nonlinear optical material thin film to form a planar waveguide structure.

14. The method according to claim 13, further comprising polishing into edges of the single-crystal non-linear optical material an entrance facet to enable light from a light source to be coupled into the planar waveguide, and an exit facet to enable light to be out-coupled from the planar waveguide.

15. The method according to claim 13, wherein forming the single crystal nonlinear optical material thin film comprises forming the single crystal nonlinear optical material thin film from Beta-Barium Borate (BBO).

16. The method according to claim 15, further comprising orienting the BBO material to provide phase matched frequency-doubling for ultraviolet generation for a visible light beam in a plane of the waveguide.

17. The method according to claim 13, further comprising depositing a cladding layer on the polished surface, the cladding layer being substantially transparent to light.

18. The method according to claim 13, wherein polishing the frequency doubling region to form a single crystal nonlinear optical material thin film includes polishing the frequency doubling region to produce a thickness variation of less than 2 micrometers in the thin film.

19. The method according to claim 13, wherein polishing the frequency doubling region to form a single crystal nonlinear optical material thin film includes performing the polishing step in an atmosphere having a relative humidity of less than 30 percent and using fluids that are anhydrous.

20. The method according to claim 13, wherein coefficients of thermal expansion of the substrate match those of the single crystal nonlinear optical material thin film.

* * * * *